(12) United States Patent
Suzuki et al.

(10) Patent No.: US 11,444,157 B2
(45) Date of Patent: Sep. 13, 2022

(54) SEMICONDUCTOR DEVICE INCLUDING FIRST AND SECOND BUFFER LAYERS

(71) Applicant: Mitsubishi Electric Corporation, Tokyo (JP)

(72) Inventors: Kenji Suzuki, Tokyo (JP); Koichi Nishi, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/069,990

(22) Filed: Oct. 14, 2020

(65) Prior Publication Data

US 2021/0273053 A1 Sep. 2, 2021

(30) Foreign Application Priority Data

Mar. 2, 2020 (JP) .............................. JP2020-034631

(51) Int. Cl.

| | |
|---|---|
| *H01L 29/08* | (2006.01) |
| *H01L 29/739* | (2006.01) |
| *H01L 29/66* | (2006.01) |
| *H01L 21/265* | (2006.01) |
| *H01L 21/324* | (2006.01) |
| *H01L 29/10* | (2006.01) |

(52) U.S. Cl.
CPC .... *H01L 29/0834* (2013.01); *H01L 21/26513* (2013.01); *H01L 21/324* (2013.01); *H01L 29/1095* (2013.01); *H01L 29/66348* (2013.01); *H01L 29/7397* (2013.01)

(58) Field of Classification Search
CPC ........... H01L 29/0834; H01L 21/26513; H01L 21/324; H01L 29/1095; H01L 29/66348; H01L 29/7397; H01L 29/36; H01L 29/861; H01L 21/263; H01L 21/26506
USPC .......................................................... 257/143
See application file for complete search history.

(56) References Cited

U.S. PATENT DOCUMENTS

| | | | | |
|---|---|---|---|---|
| 9,385,211 B2 * | 7/2016 | Miyazaki | ............ | H01L 29/6609 |
| 10,304,928 B2 * | 5/2019 | Tamura | ................. | H01L 29/739 |
| 10,415,154 B2 * | 9/2019 | Nakamura | .......... | H01L 29/0878 |
| 10,490,646 B2 * | 11/2019 | Onozawa | ............ | H01L 29/0804 |

(Continued)

FOREIGN PATENT DOCUMENTS

| | | | | |
|---|---|---|---|---|
| WO | WO-2013073623 A1 * | 5/2013 | ........... | H01L 21/263 |
| WO | 2014-065080 A1 | 5/2014 | | |

(Continued)

*Primary Examiner* — Mohammad M Hoque
(74) *Attorney, Agent, or Firm* — Studebaker & Brackett PC

(57) ABSTRACT

An object is to provide a technique of improving productivity of a semiconductor device. A first buffer layer includes a first portion located in a thickness direction of a semiconductor substrate from a main surface and having a first peak of an N type impurity concentration and a second portion located farther away from the main surface than the first portion and having a second peak of an N type impurity concentration. A distance from the main surface to the first portion is equal to or smaller than 4.0 μm, and a distance from the first portion to the second portion is equal to or larger than 14.5 μm. An N type impurity concentration of a portion between the first portion and the second portion is higher than an N type impurity concentration of a drift layer.

13 Claims, 19 Drawing Sheets

(56) References Cited

U.S. PATENT DOCUMENTS

| | | | | |
|---|---|---|---|---|
| 2014/0299915 A1* | 10/2014 | Kouno | ............... | H01L 29/7397 |
| | | | | 257/139 |
| 2015/0179441 A1 | 1/2015 | Onozawa et al. | | |
| 2016/0276446 A1* | 9/2016 | Wakimoto | ............. | H01L 29/36 |
| 2017/0271450 A1* | 9/2017 | Takahashi | ......... | H01L 21/26506 |
| 2018/0053655 A1* | 2/2018 | Kawase | ................ | H01L 21/268 |
| 2018/0337050 A1* | 11/2018 | Mizushima | ............ | H01L 22/30 |

FOREIGN PATENT DOCUMENTS

| WO | WO-2021070539 A1 * | 4/2021 |
|---|---|---|
| WO | WO-2021125064 A1 * | 6/2021 |
| WO | WO-2021125140 A1 * | 6/2021 |

\* cited by examiner

F I G. 1
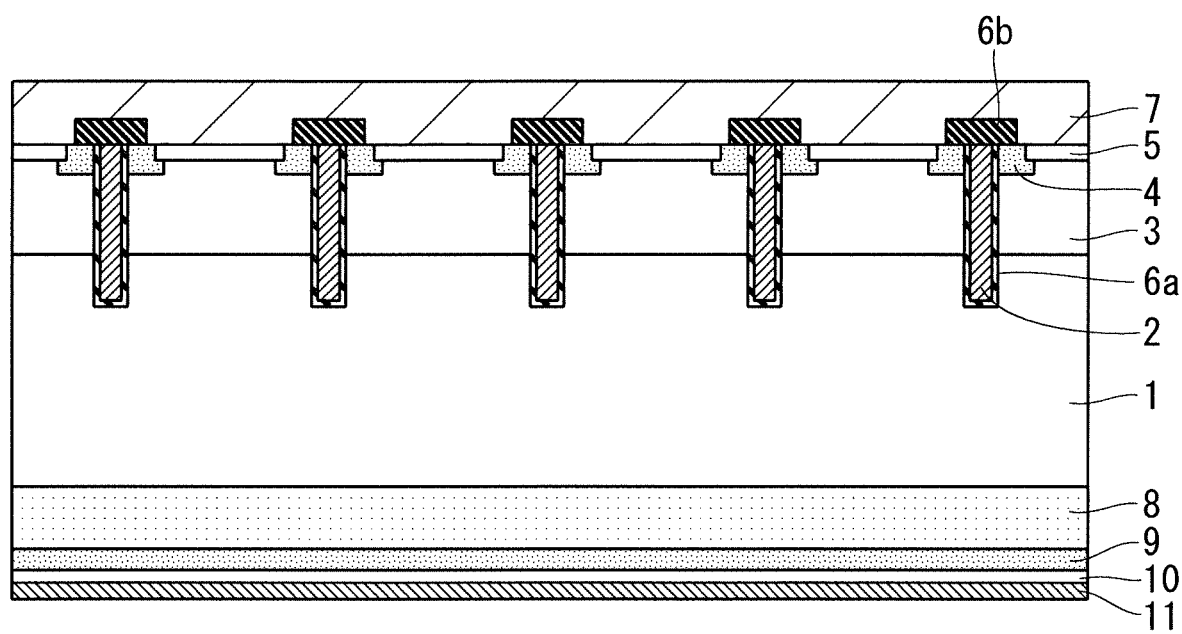

F I G 7
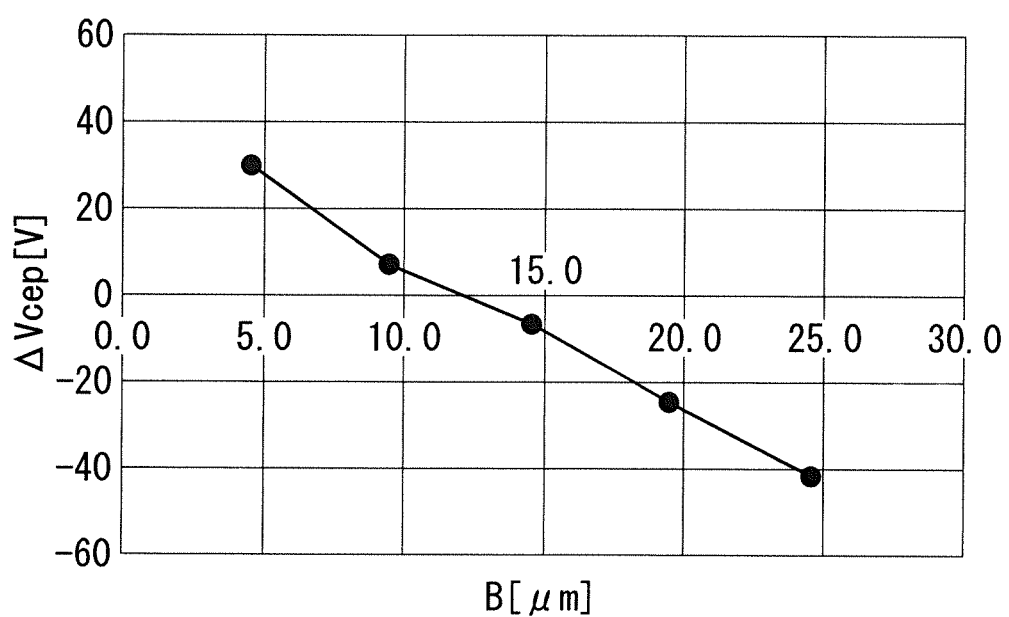

F I G. 2 5
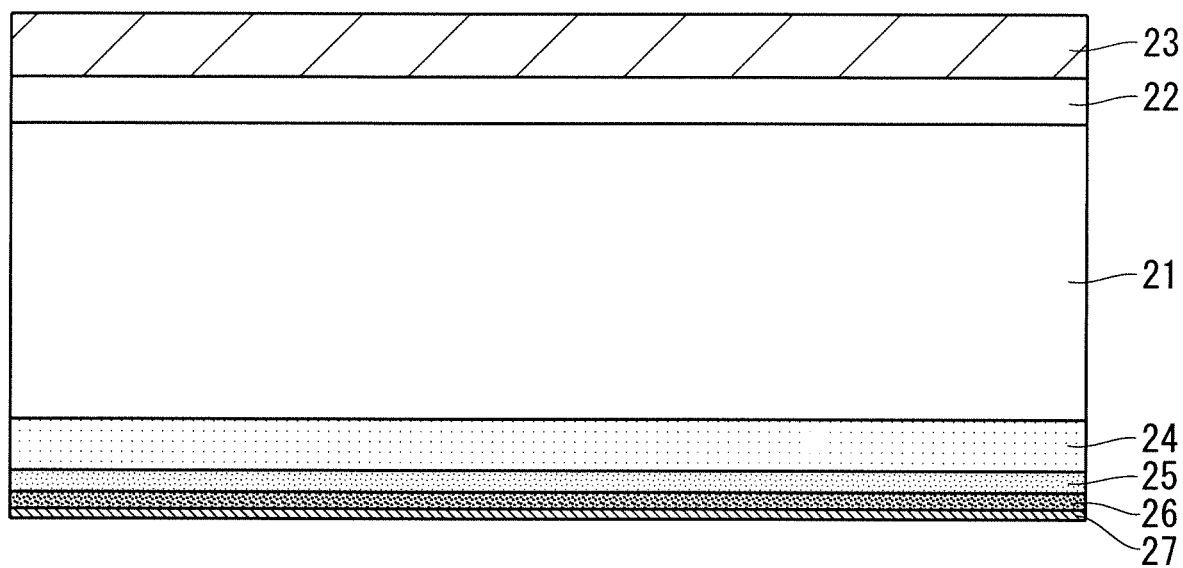

SEMICONDUCTOR DEVICE INCLUDING FIRST AND SECOND BUFFER LAYERS

FIELD OF THE INVENTION

The present disclosure relates to a semiconductor device and a method of manufacturing a semiconductor device.

DESCRIPTION OF THE BACKGROUND ART

Required in a conventional vertical semiconductor device is that an extension of a depletion layer from an interface between a P type region and an N type region disposed on a front surface side of the semiconductor device to a rear surface side is stopped at a predetermined depth when voltage is applied in a vertical direction (a thickness direction of the semiconductor substrate). According to such a configuration of stopping the extension of the depletion layer, surge voltage at a time of switch-off (at a time of transition from a conductive state to a non-conductive state of the semiconductor device) and a vibration (oscillation) phenomenon of the applied voltage of the semiconductor device caused by the surge voltage can be suppressed.

A technique of implanting proton from the rear surface side of the semiconductor device to form a buffer layer is proposed for a purpose of stopping the depletion layer at the predetermined depth. Specifically proposed is a technique of implanting proton at an acceleration voltage changed twice from an acceleration voltage at an initial implantation, that is to say, an acceleration voltage with three steps, thereby forming a buffer layer having three peaks at a predetermined depth from a rear surface side of a semiconductor device (for example, International Publication No. 2014/065080).

SUMMARY

Although depending on a specification of a semiconductor device, an implantation time of approximately two minutes is required for implanting proton, and change time (switch time) of approximately five minutes is required for changing acceleration voltage for the proton implantation. Thus, when proton is implanted at an acceleration voltage with three steps, that is to say, when the acceleration voltage is changed twice from an acceleration voltage at an initial implantation, approximately six minutes in total are required for implantation time, and approximately ten minutes in total are required for change time of the acceleration voltage, thus the longer time is required for the change time than the implantation time.

In this manner, in the conventional semiconductor device in which the acceleration voltage for implanting proton is changed at least twice for forming the buffer layer, the time required for changing the acceleration voltage is long, thus there is room for improving productivity using an ion implanter.

The present disclosure is therefore has been made to solve problems as described above, and it is an object of the present disclosure to provide a technique improving productivity of a semiconductor device.

A semiconductor device according to the present disclosure includes a semiconductor substrate having a main surface, wherein the semiconductor substrate includes: an N type drift layer; an N type first buffer layer disposed on a side of the main surface of the drift layer to be adjacent to the drift layer and including proton as an N type impurity; and an N type second buffer layer disposed on a side of the main surface of the first buffer layer to be adjacent to the first buffer layer and including an N type impurity different from proton, the first buffer layer includes: a first portion located in a thickness direction of the semiconductor substrate from the main surface and having a first peak of an N type impurity concentration; and a second portion located farther away from the main surface than the first portion and having a second peak of an N type impurity concentration, a distance from the main surface to the first portion is equal to or smaller than 4.0 µm, a distance from the first portion to the second portion is equal to or larger than 14.5 µm, and an N type impurity concentration of a portion between the first portion and the second portion is higher than an N type impurity concentration of the drift layer.

Productivity of the semiconductor device can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view illustrating a major structure of a semiconductor device according to an embodiment 1.

FIG. 7 is a drawing illustrating a relationship between a distance B and ΔVcep.

FIG. 25 is a cross-sectional view illustrating a major structure of a semiconductor device according to an embodiment 2.

DESCRIPTION OF THE PREFERRED EMBODIMENTS

Figure 2:
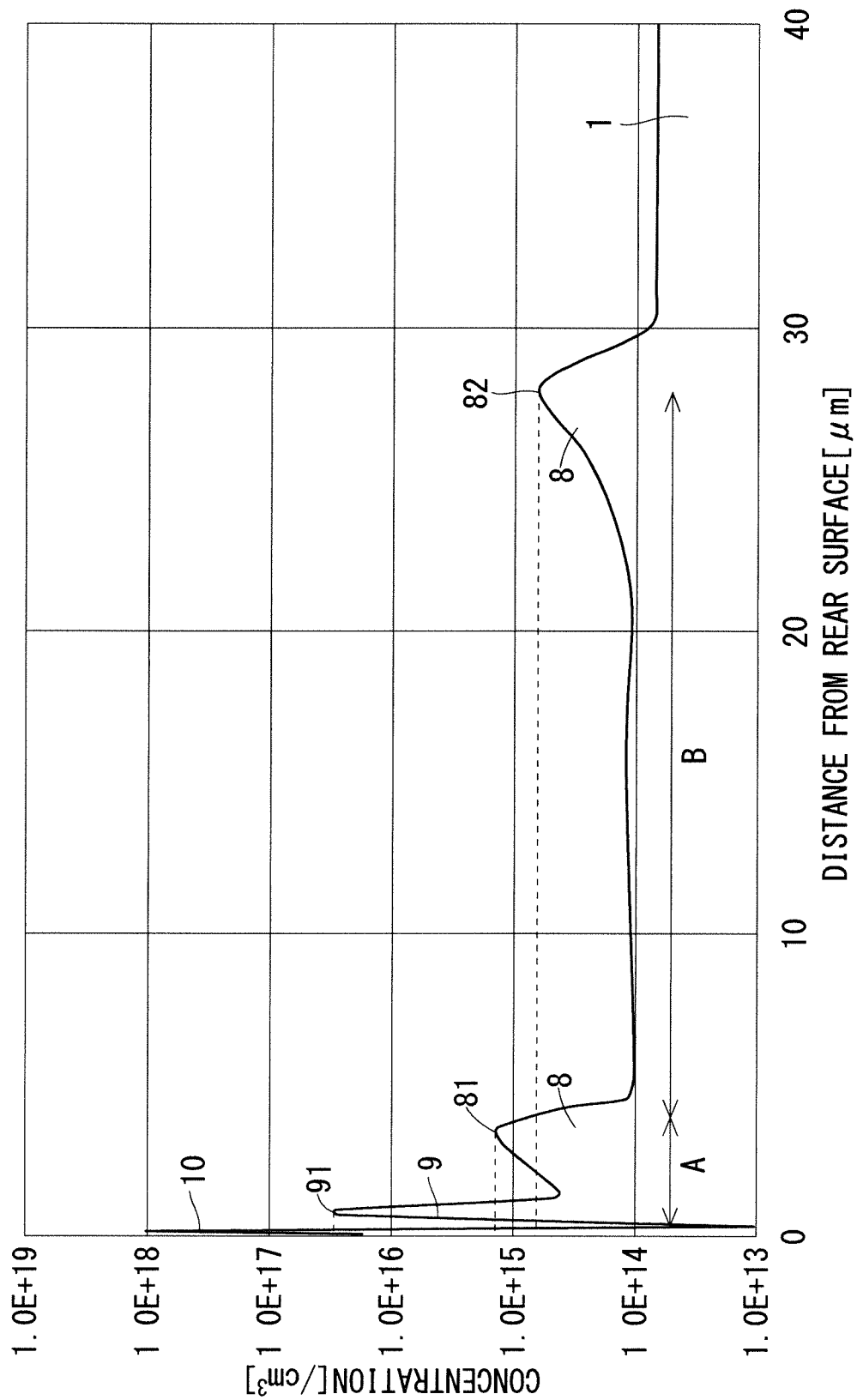
FIG. 2 is a drawing illustrating a profile of an impurity concentration on a rear surface side of the semiconductor device according to the embodiment 1.

Embodiments are described hereinafter with reference to the appended drawings. Characteristics in each embodiment described hereinafter are for exemplification, thus all characteristics are not necessary. The same or similar reference numerals will be assigned to the similar constituent elements in the plurality of embodiments, and the different constituent elements are mainly described hereinafter. In the following description, a specific position and direction such as "upper", "lower", "left", "right", "front", or "rear" may not necessarily coincide with to directions in practical implementation. The description that a certain portion has a concentration higher than the other portion means that an average of concentration of the certain portion is higher than that in the other portion, for example. In contrast, the description that a certain portion has a concentration lower than the other portion means that an average of concentration of the certain portion is lower than that in the other portion, for example.

Embodiment 1

Described hereinafter is an example that a semiconductor device according to the present embodiment 1 is an insulated gate bipolar transistor (IGBT).

FIG. 1 is a cross-sectional view of a major structure of the semiconductor device according to the present embodiment 1. The semiconductor device in FIG. 1 includes a semiconductor substrate with a front surface and a rear surface (main surface), and the semiconductor substrate includes a drift layer 1, a base layer 3, a source layer 4, a diffusion layer 5, a first buffer layer 8, a second buffer layer 9, and a collector layer 10. A conductive type of the drift layer 1 is an N type. In the present embodiment 1, a portion other than the base layer 3, the source layer 4, the diffusion layer 5, the first buffer layer 8, the second buffer layer 9, and the collector layer 10 in the semiconductor substrate substantially constitutes the drift layer 1.

The base layer 3 is disposed on a side of the front surface of the drift layer 1 to be adjacent to the drift layer 1. A conductive type of the base layer 3 is a P type.

The source layer 4 and the diffusion layer 5 are disposed on the front surface of the semiconductor substrate, and are disposed on a side of the front surface of the base layer 3 to be adjacent to the base layer 3. A conductive type of the source layer 4 is an N type, and an N type impurity concentration of the source layer 4 is higher than that of the drift layer 1. A conductive type of the diffusion layer 5 is a P type, and a P type impurity concentration of the diffusion layer 5 is higher than that of the base layer 3.

A trench is disposed to pass through the source layer 4 and the base layer 3 from the front surface of the semiconductor substrate and reach the drift layer 1. A gate electrode 2 is disposed on an inner wall of the trench via an insulating film 6a. An insulating film 6b is disposed on at least part of the gate electrode 2, the insulating film 6a, and the source layer 4, and an emitter electrode 7 is disposed on at least part of the insulating film 6b, the source layer 4, and the diffusion layer 5.

The first buffer layer 8 is disposed on a side of a rear surface of the drift layer 1 to be adjacent to the drift layer 1. A conductive type of the first buffer layer 8 is an N type, and the first buffer layer 8 includes proton as an N type impurity. In the present embodiment 1, an N type impurity concentration of the first buffer layer 8 is higher than that of the drift layer 1.

The second buffer layer 9 is disposed on a side of a rear surface of the first buffer layer 8 to be adjacent to the first buffer layer 8. The second buffer layer 9 includes an N type impurity different from proton, and a conductive type of the second buffer layer 9 is an N type. In the present embodiment 1, an N type impurity of the second buffer layer 9 is phosphorus, and an N type impurity concentration of the second buffer layer 9 is higher than that of the first buffer layer 8.

The collector layer 10 is disposed on the rear surface of the semiconductor substrate, and is disposed on a side of a rear surface of the second buffer layer 9 to be adjacent to the second buffer layer 9. A conductive type of the collector layer 10 is a P type.

A collector electrode 11 is disposed on the rear surface of the semiconductor substrate, that is to say, on an opposite portion of the collector 10 from the second buffer layer 9.

The second buffer layer 9 has a function of suppressing surge voltage and oscillation at a time of switch-off and reducing leakage current in the manner similar to the first buffer layer 8. Herein, with regard to an activation rate by heating, an activation rate of phosphorus is approximately 70 to 100%, and an activation rate of proton is approximately 0.5 to 2%. Thus, in a case of implanting phosphorus ion and then performing heat processing to form the second buffer layer 9, an ion implantation amount and an implantation time can be reduced compared with a case of forming the first buffer layer 8 including proton equivalent to phosphorus ion. That is to say, when the second buffer layer 9 is formed, the ion implantation time for forming the whole buffer layer can be reduced, thus productivity using the ion implanter can be improved.

The drift layer 1 is made up so that the drift layer 1 has specific resistance equal to or larger than 50 Ω·cm and equal to or smaller than 67 Ω·cm and a total thickness of the drift layer 1, the first buffer layer 8, and the second buffer layer 9 (referred to as "the three layer total thickness" hereinafter) is equal to or larger than 110 μm and equal to or smaller than 130 μm. Confirmed by a simulation is that an IGBT with withstand voltage-class of 1200 V can be achieved by such a configuration. Also confirmed is that when a peak concentration of the base layer 3 is set to equal to or larger than 8.0E16 and equal to or smaller than 5.0E17/cm$^3$, a threshold voltage Vth of a gate at a time when current starts flowing from a collector to an emitter is approximately 6 V.

FIG. 2 is a drawing illustrating a profile of an impurity concentration on the side of the rear surface of the semiconductor device according to the present embodiment 1. The first buffer layer 8 includes a first portion located to in a thickness direction of the semiconductor substrate from the rear surface of the semiconductor substrate and having a first peak 81 of N type impurity concentration and a second portion located farther away from the rear surface of the semiconductor substrate than the first portion and having a second peak 82 of N type impurity concentration. The peak herein corresponds to a local maximum value (peak value) of the impurity concentration. The N type impurity concentration of a portion between the first portion of the first peak 81 and the second portion of the second peak 82 is higher than the N type impurity concentration of the drift layer 1.

The first peak 81 is preferably higher than the second peak 82. According to such a configuration, the first peak 81 and the second peak 82 have a relationship that the N type impurity concentration gets higher with decreasing distance to the rear surface, thus an envelope curve connecting the maximum values of the first peak 81 and the second peak 82 gets close to gauss distribution. Accordingly, even when the implantation amount of the impurity of the second peak 82 is reduced, the surge voltage at the time of switch-off can be suppressed. As a result, the implantation amount of proton for forming the first buffer layer 8 can be reduced, thus the productivity using the ion implanter can be improved. The first peak 81 of the N type impurity concentration is equal to or larger than $1.0E15/cm^3$ and equal to or smaller than $5.0E15/cm^3$, and the second peak 82 of the N type impurity concentration is equal to or larger than $2.0E14/cm^3$ and equal to or smaller than $1.0E15/cm^3$, for example.

In the present embodiment 1, a peak 91 of the N type impurity concentration of the second buffer layer 9 is higher than the first peak 81 of the N type impurity concentration of the first buffer layer 8. With regard to a half-value width which is half the peak concentration indicating a spread of impurity in a depth direction, a half-value width of the first peak 81 is smaller than the half-value width of the second peak 82, and a half-value width of the peak 91 of the second buffer layer 9 is smaller than a half-value width of the first peak 81.

According to such a configuration, the peak 91, the first peak 81, and the second peak 82 have a relationship that the N type impurity concentration gets higher with decreasing distance to the rear surface, and the spread of the impurity in the depth direction is reduced, thus an envelope curve connecting the maximum values of the peak 91, the first peak 81, and the second peak 82 gets close to gauss distribution. Accordingly, even when the implantation amount of the impurity of the first peak 81 and the second peak 82 is reduced, the surge voltage at the time of switch-off can be suppressed. As a result, the implantation amount of proton for forming the first buffer layer 8 and the second buffer layer 9 can be further reduced, thus the productivity using the ion implanter can be further improved. The peak 91 of the N type impurity concentration of the second buffer layer 9 is equal to or larger than $1.0E16/cm^3$ and equal to or smaller than $8.0E16/cm^3$, for example. A half-value width of the peak 91 is approximately 0.3 μm, a half-value width of the first peak 81 is approximately 1.6 μm, and a half-value width of the second peak 82 is approximately 2.7 μm, for example.

Herein, as illustrated in FIG. 2, a distance from the rear surface of the semiconductor substrate to the first portion of the first peak 81 is defined as A and a distance from the first portion of the first peak 81 to the second portion of the second peak 82 is defined as B. The first buffer layer 8 according to the present embodiment 1 is made up to satisfy A≤4.0 μm and B≥14.5 μm. In this case, the surge voltage at the time of switch-off can be suppressed. This configuration is described hereinafter using FIG. 3 to FIG. 11.

Figure 3:
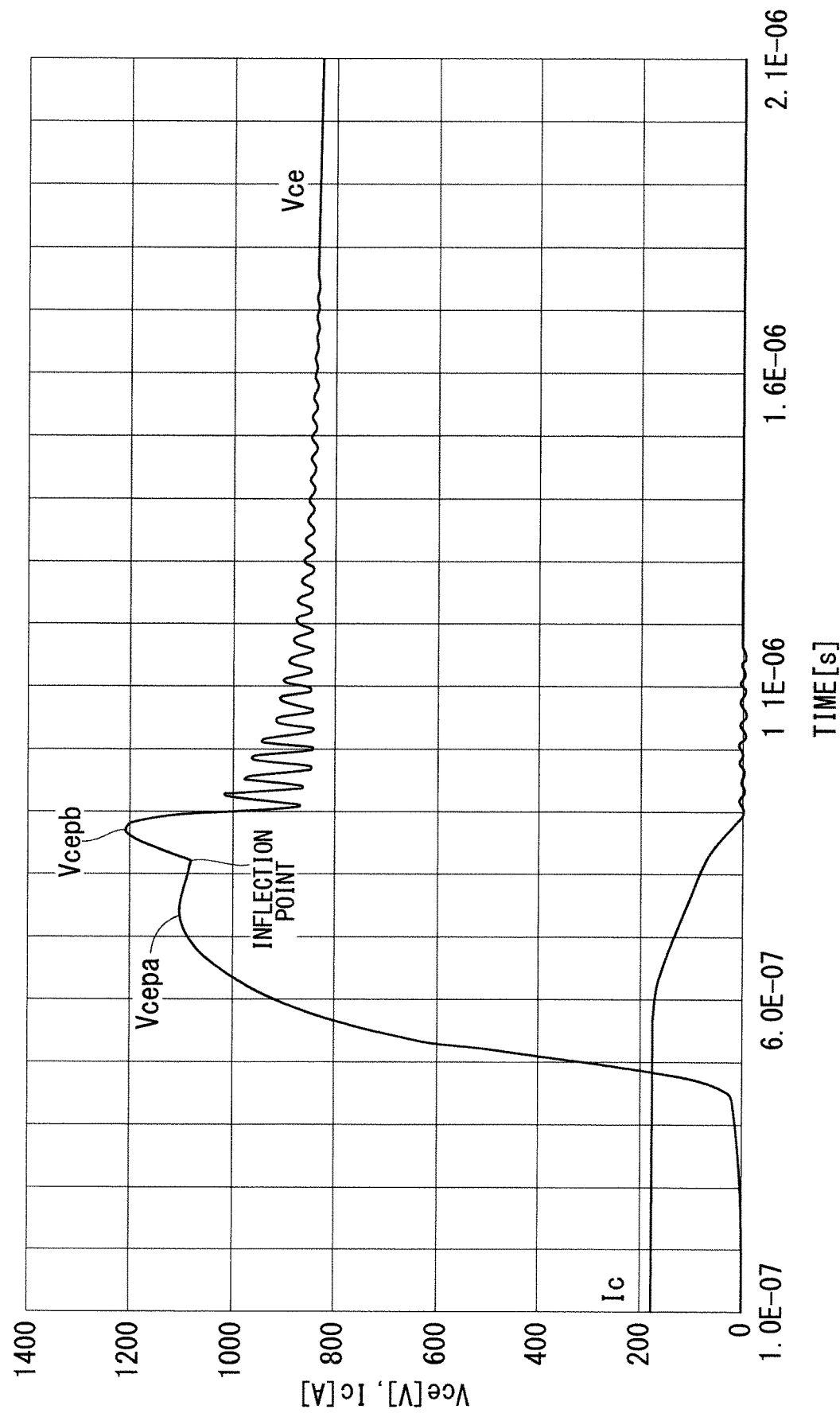
FIG. 3 is a drawing showing a simulation result of a device contrasted with the semiconductor device according to the present embodiment 1.

FIG. 3 is a drawing showing a result of preforming a device simulation for investigating the surge voltage on a device, which includes the second buffer layer 9 but does not include the first buffer layer 8, contrasted with the semiconductor device according to the present embodiment 1. FIG. 3 shows a time change of a voltage Vce between the emitter and the collector and a collector current Ic at the time of switch-off. Adopted as the simulation device is an IGBT in which a rated voltage and a rated current are 1200V and 175 A, respectively, a thickness of a wafer is 110 μm, a specific resistance is 67 Ω·cm, and a front surface has a trench structure.

As illustrated in FIG. 3, in the IGBT which does not include the first buffer layer 8, relatively large surge voltage and oscillation occur in the voltage Vce at the time of switch-off. Specifically, after the voltage Vce nearly reaches a peak (Vcepa) once and an inflection point appears, a depletion layer reaches the side of the rear surface, thus a protrusion (Vcepb) which is the surge voltage and a large peak of the voltage occurs. Performed is a simulation for suppressing this protrusion (Vcepb).

Firstly prepared are a plurality of devices each including the first buffer layer 8 and the second buffer layer 9, and each having a rear surface profile with a distance B of different length described above as illustrated in FIG. 4. The simulation device is largely the same as the device in FIG. 3 except for the first buffer layer 8. The profile of the first buffer layer 8 is formed by processing the second portion having the length of B in the device generated in accordance with an observation result. The distance A from the rear surface to the portion of the first peak 81 is fixed to 3.5 μm.

Figure 4:
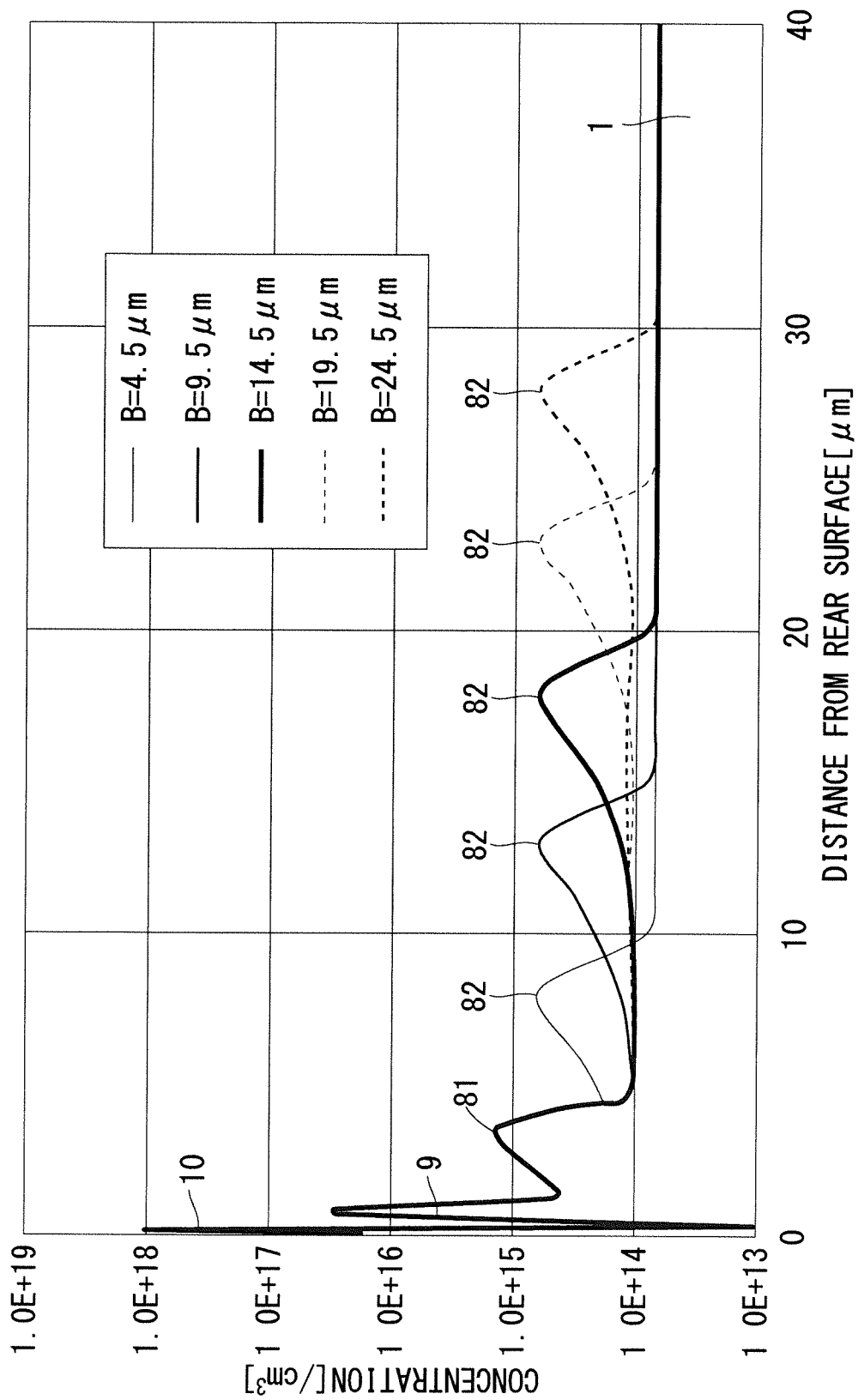
FIG. 4 is a drawing illustrating a rear surface profile of a simulation device.
Figure 5:
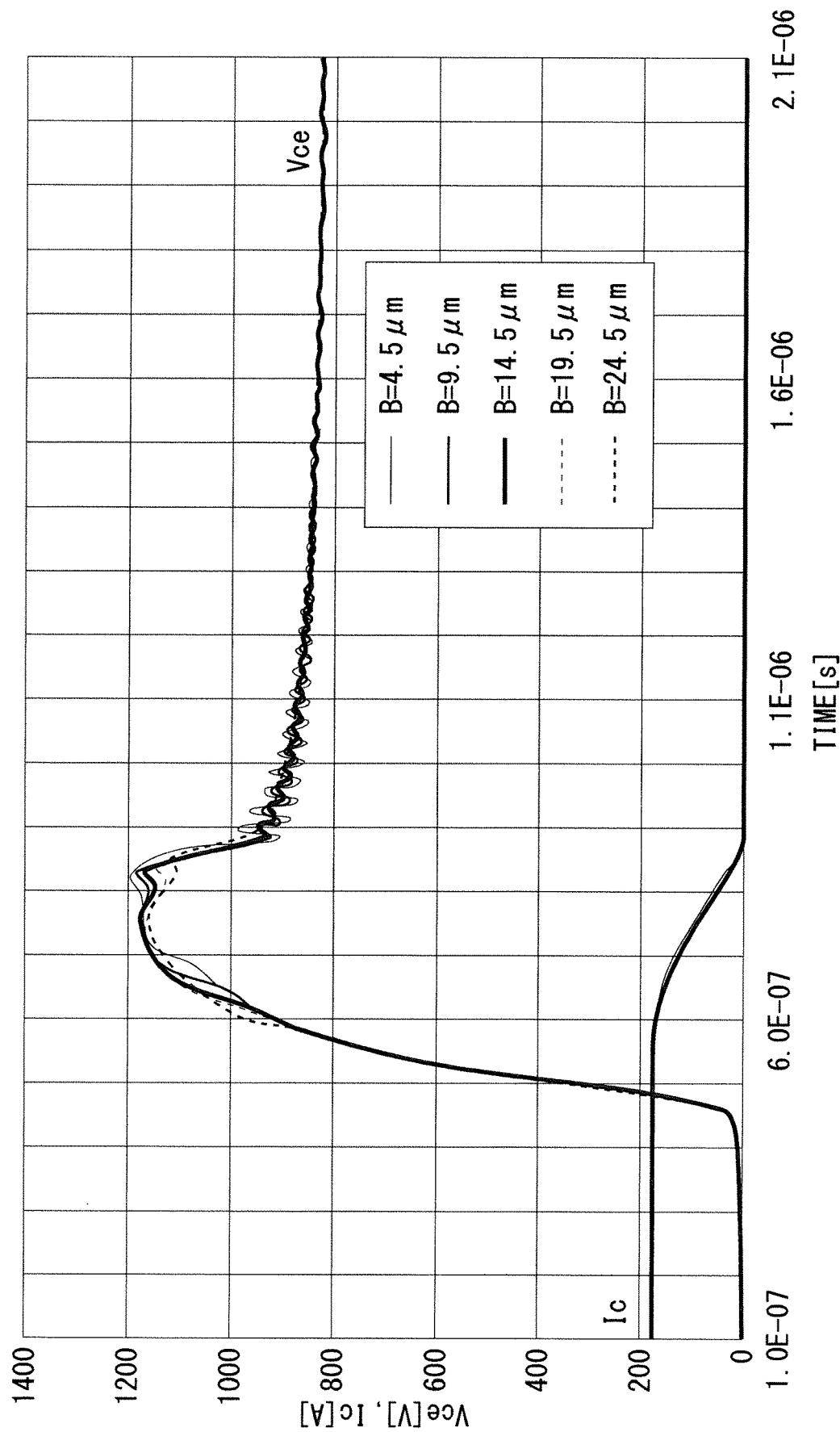
FIG. 5 is a drawing showing a simulation result of the simulation device.
Figure 6:
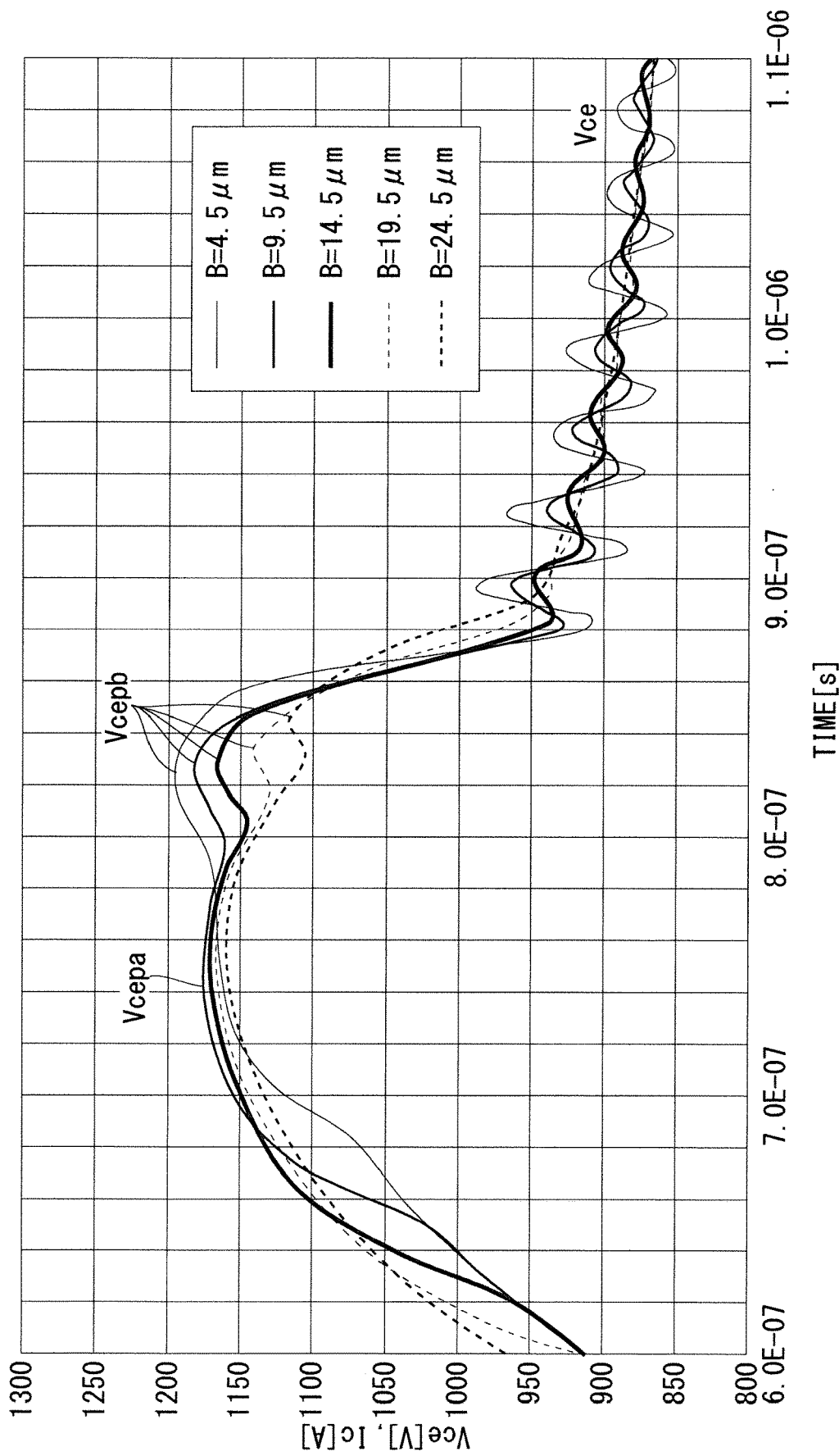
FIG. 6 is an enlarged view showing a simulation result of the simulation device.

FIG. 5 is a drawing showing a result of preforming a device simulation for investigating the surge voltage on the device in FIG. 4 in the manner similar to the device in FIG. 3. FIG. 6 is an enlarged view of enlarging part of FIG. 5. A sign of Vcepa is collectively shown in FIG. 6 to prevent complication of the drawing.

ΔVcep=Vcepb-Vcepa is calculated based on the peak Vcepa of the voltage Vce before the inflection point appears at a time ranging from 7E-7 seconds to 8E-7 seconds [s] and the maximum value Vcepb of the voltage Vce after the inflection point appears at a time ranging from 8E-7 seconds to 9E-7 seconds [s]. The investigation is performed based on a condition where the protrusion of the voltage which may cause withstand voltage breakdown of the semiconductor device occurs if ΔVcep takes a positive value, and the protrusion does not occur when ΔVcep takes a value equal to or smaller than 0.

FIG. 7 is a drawing illustrating a relationship between the distance B and ΔVcep. When the distance B is equal to or larger than 14.5 μm, ΔVcep takes a negative value, and the occurrence of the protrusion of the voltage which may cause the withstand voltage breakdown of the semiconductor device is suppressed. Thus, when the device is made up so that the distance B is equal to or larger than 14.5 μm, increase in the surge voltage can be suppressed.

Prepared next are a plurality of devices each including the first buffer layer 8 and the second buffer layer 9, and each having a rear surface profile with a distance A of different length described above as illustrated in FIG. 8. The simulation device is largely the same as the device in FIG. 3 except for the first buffer layer 8. The profile of the first buffer layer 8 is formed by processing the first portion having the length of A in the device generated in accordance with an observation result. The distance B from the first portion of the first peak 81 to the second portion of the second peak 82 is fixed to 14.5 μm.

Figure 8:
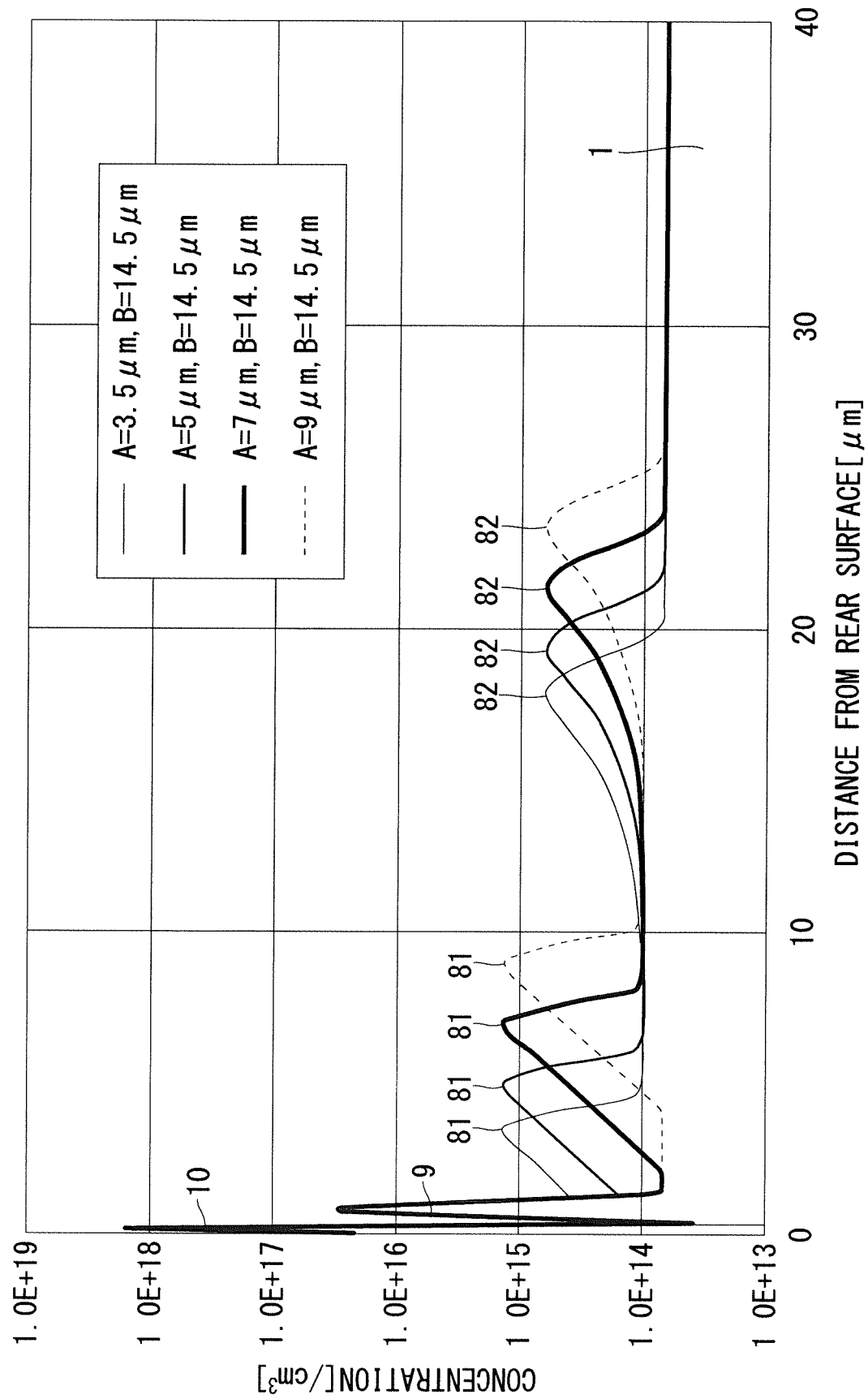
FIG. 8 is a drawing illustrating a rear surface profile of the simulation device.
Figure 9:
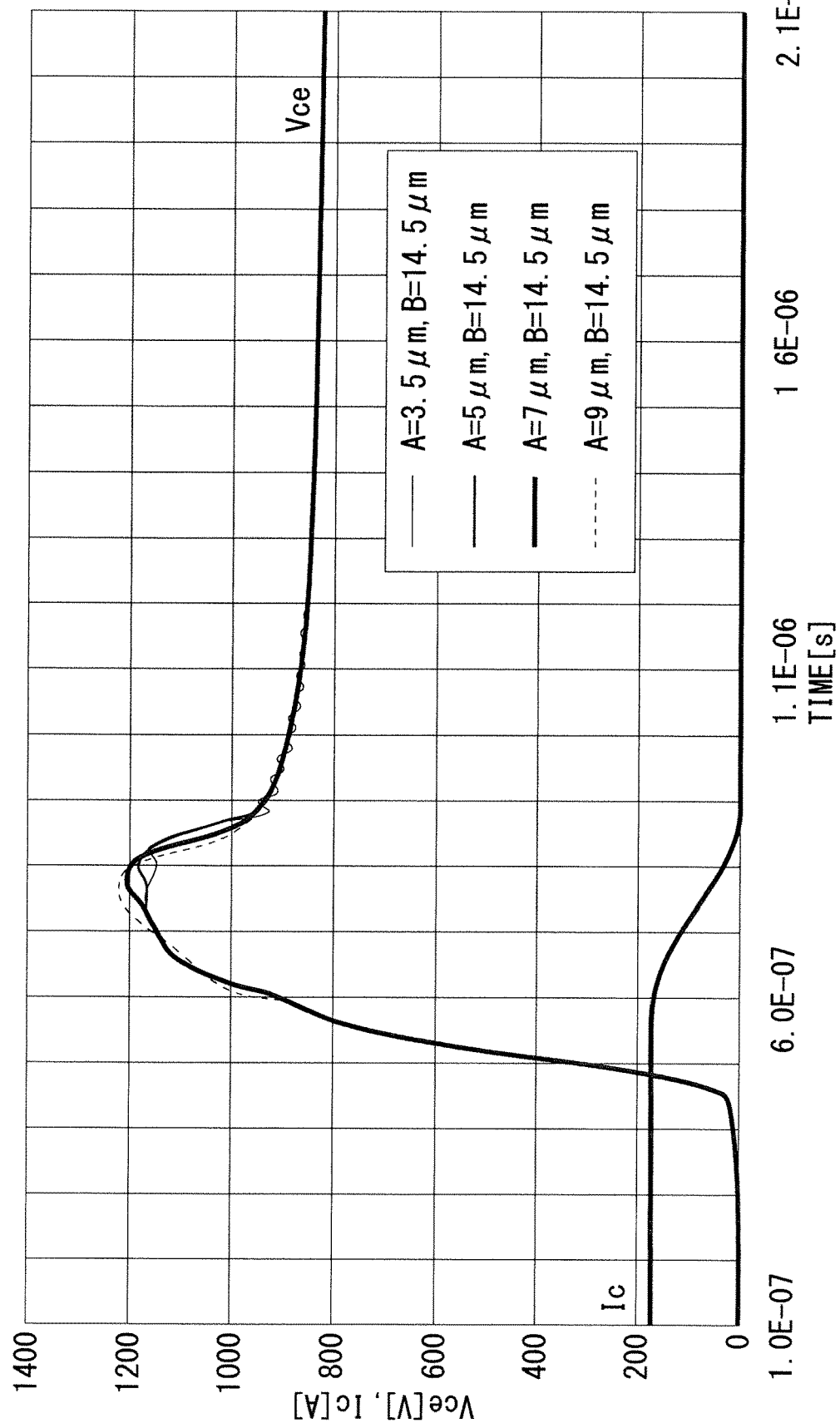
FIG. 9 is a drawing showing a simulation result of the simulation device.
Figure 10:
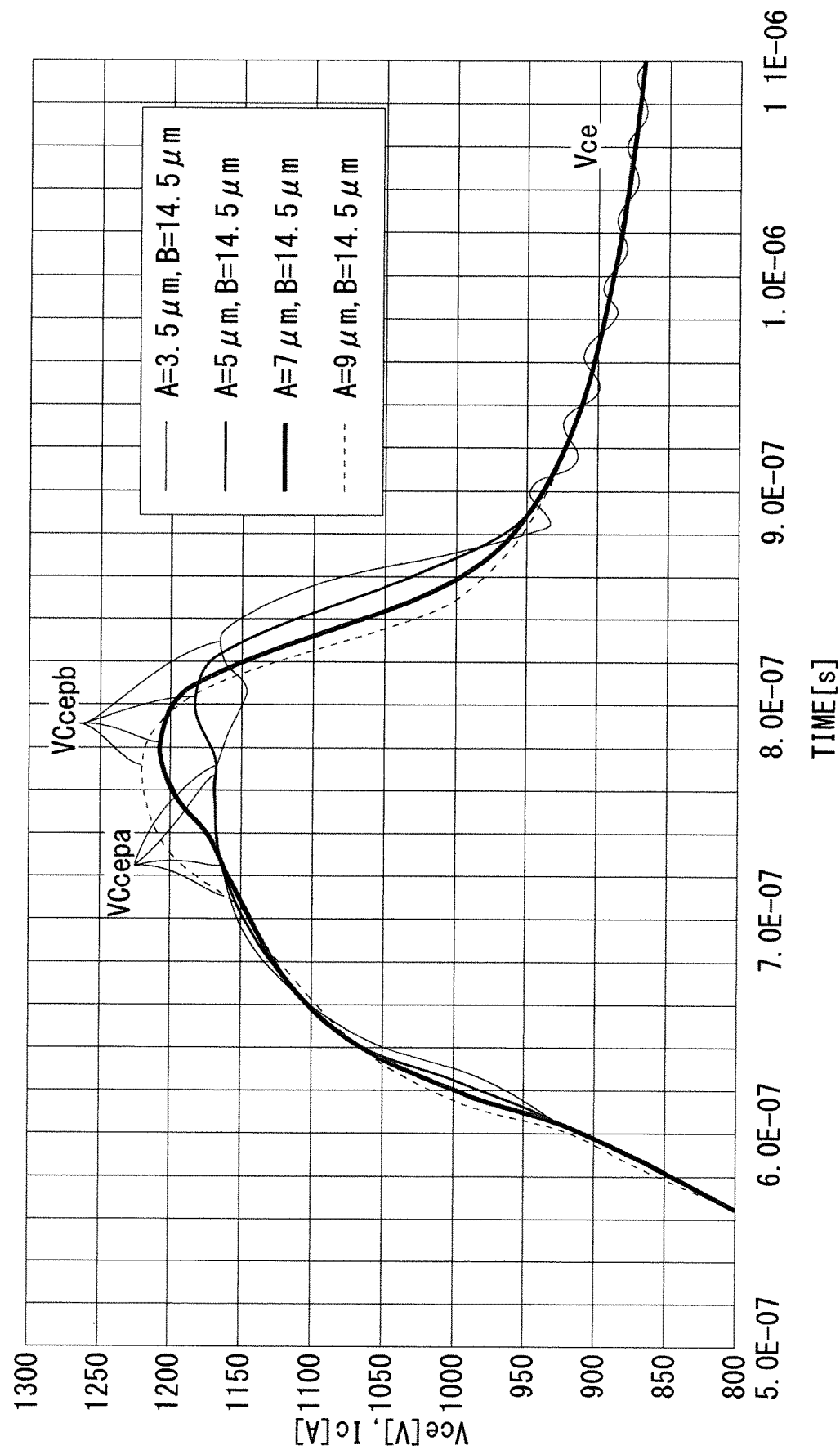
FIG. 10 is an enlarged view showing a simulation result of the simulation device.
Figure 11:
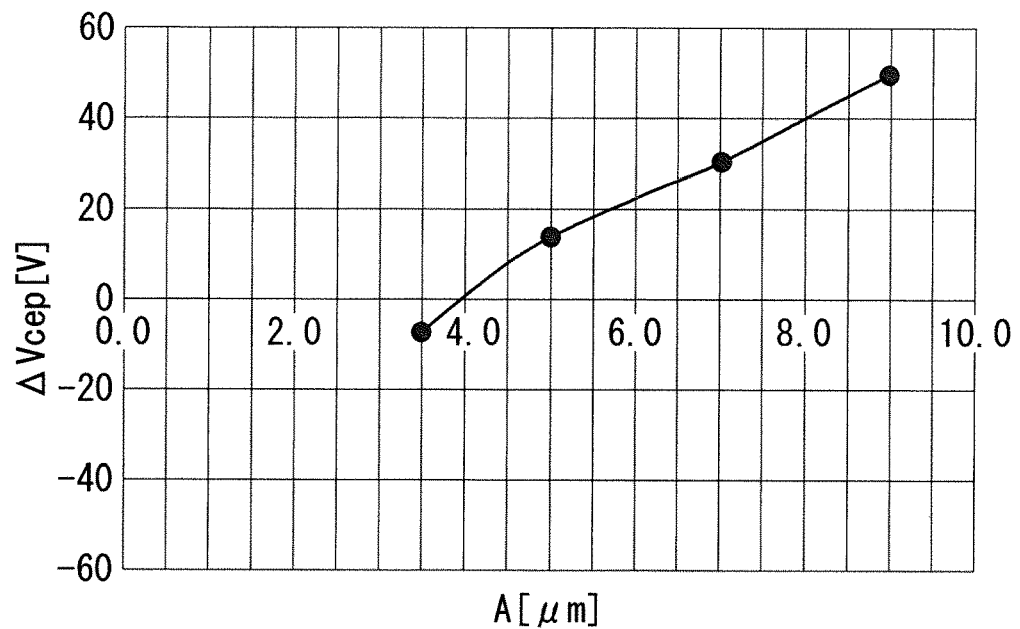
FIG. 11 is a drawing illustrating a relationship between a distance A and ΔVcep.

FIG. 9 is a drawing showing a result of preforming a device simulation for investigating the surge voltage on the device in FIG. 8 in the manner similar to the device in FIG. 3. FIG. 10 is an enlarged view of enlarging part of FIG. 9. FIG. 11 is a drawing illustrating a relationship between the distance A and ΔVcep. When the distance A is equal to or smaller than 4.0 μm, ΔVcep takes a negative value, and the occurrence of the protrusion of the voltage which may cause the withstand voltage breakdown of the semiconductor device is suppressed. Thus, when the device is made up so that the distance A is equal to or smaller than 4.0 μm, increase in the surge voltage can be suppressed.

As seen from the above, the first buffer layer 8 according to the present embodiment 1 is made up to satisfy A≤4.0 μm and B≥14.5 μm, thus the surge voltage at the time of switch-off can be suppressed.

Confirmed next by the simulation is that the structure satisfying the above relationship regarding the distance A and the distance B and having the specific resistance of the drift layer 1 and the three layer total thickness has the effect of suppressing the surge voltage inducing the oscillation at the time of switch-off and also has withstand voltage described below.

For example, when the specific resistance of the drift layer 1 is equal to or larger than 90 Ω·cm and equal to or smaller than 130 Ω·cm and the three layer total thickness is equal to or larger than 170 μm and equal to or smaller than 210 μm, an IGBT with withstand voltage-class of 1700 V can be achieved. When the specific resistance of the drift layer 1 is equal to or larger than 130 Ω·cm and equal to or smaller than 180 Ω·cm and the three layer total thickness is equal to or larger than 200 μm and equal to or smaller than 260 μm, an IGBT with withstand voltage-class of 2000 V can be achieved.

When the specific resistance of the drift layer 1 is equal to or larger than 200 Ω·cm and equal to or smaller than 300 Ω·cm and the three layer total thickness is equal to or larger than 340 μm and equal to or smaller than 420 μm, an IGBT with withstand voltage-class of 3300 V can be achieved. When the specific resistance of the drift layer 1 is equal to or larger than 300 Ω·cm and equal to or smaller than 400 Ω·cm and the three layer total thickness is equal to or larger than 420 μm and equal to or smaller than 520 μm, an IGBT with withstand voltage-class of 4500 V can be achieved. When the specific resistance of the drift layer 1 is equal to or larger than 600 Ω·cm and equal to or smaller than 800 Ω·cm and the three layer total thickness is equal to or larger than 580 μm and equal to or smaller than 720 μm, an IGBT with withstand voltage-class of 6500 V can be achieved.

<Manufacturing Method>

A method of manufacturing the semiconductor device according to the present embodiment 1 is described hereinafter. Firstly, a semiconductor substrate including a front surface and a rear surface (main surface) is prepared, and a front surface structure is formed on a side of the front surface of the semiconductor substrate. A method of manufacturing the front surface structure is similar to a method of manufacturing a normal IGBT, thus the description thereof is omitted.

Figure 12:
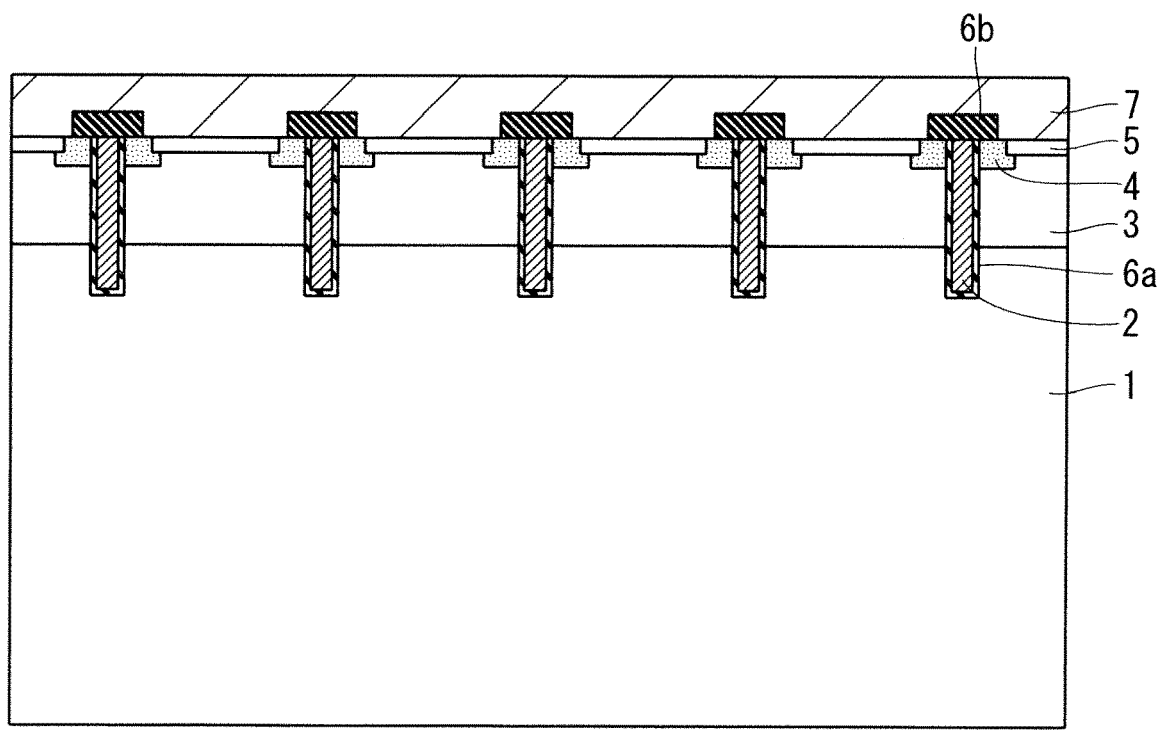
FIG. 12 is a cross-sectional view illustrating a method of manufacturing the semiconductor device according to the embodiment 1.

FIG. 12 is a drawing illustrating a structure at a time when a surface process of forming the front surface structure on the semiconductor substrate is completed. At this time, the thickness of each of the semiconductor substrate and the drift layer 1 is relatively large, and the thickness of the semiconductor substrate is substantially the same as a thickness of a bare wafer, that is approximately 700 μm, for example.

Figure 13:
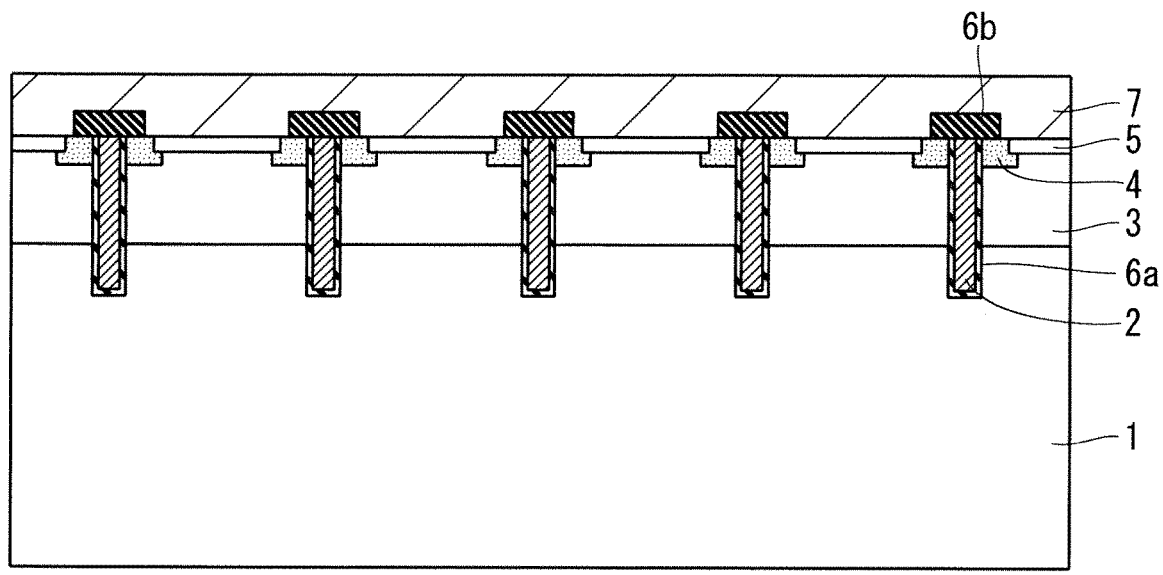
FIG. 13 is a cross-sectional view illustrating a method of manufacturing the semiconductor device according to the embodiment 1.
Figure 14:
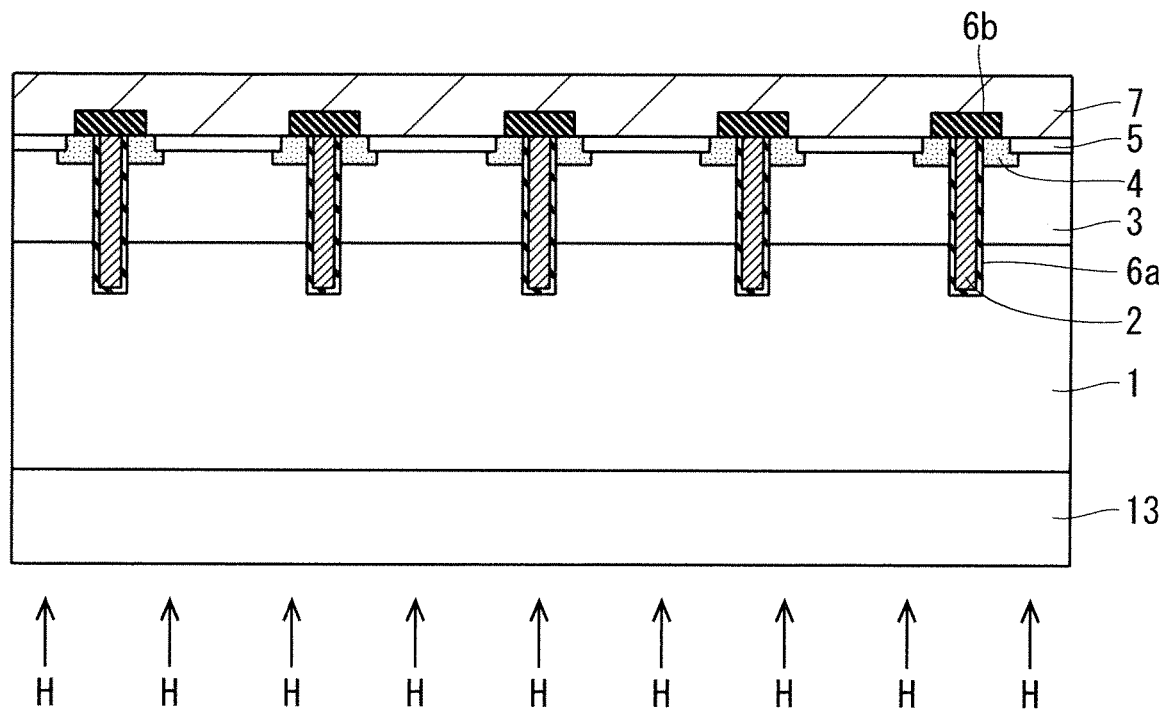
FIG. 14 is a cross-sectional view illustrating a method of manufacturing the semiconductor device according to the embodiment 1.

As illustrated in FIG. 13, the rear surface of the semiconductor substrate is ground to have a desired thickness by a grinder or wet etching. Next, as illustrated in FIG. 14, after proton (H) is implanted into the second portion satisfying the distance A and the distance B described above, the acceleration voltage is changed, and proton is implanted into the first portion satisfying the distance A described above. In this manner, proton as the N type impurity is implanted from the rear surface of the semiconductor substrate at two types of acceleration voltage, thus an N type first impurity layer 13 is formed in a first surface portion on the side of the rear surface of the semiconductor substrate. The first impurity layer 13 formed in the manner described above is a layer constituting the first buffer layer 8, and includes the first portion having the first peak 81 and the second portion having the second peak 82 in the manner similar to the first buffer layer. Change of implantation angle or an absorber may also be applied instead of the change of the acceleration voltage. In this case, an implantation depth of the first portion and the second portion can be controlled, and an implantation time can be reduced.

Figure 15:
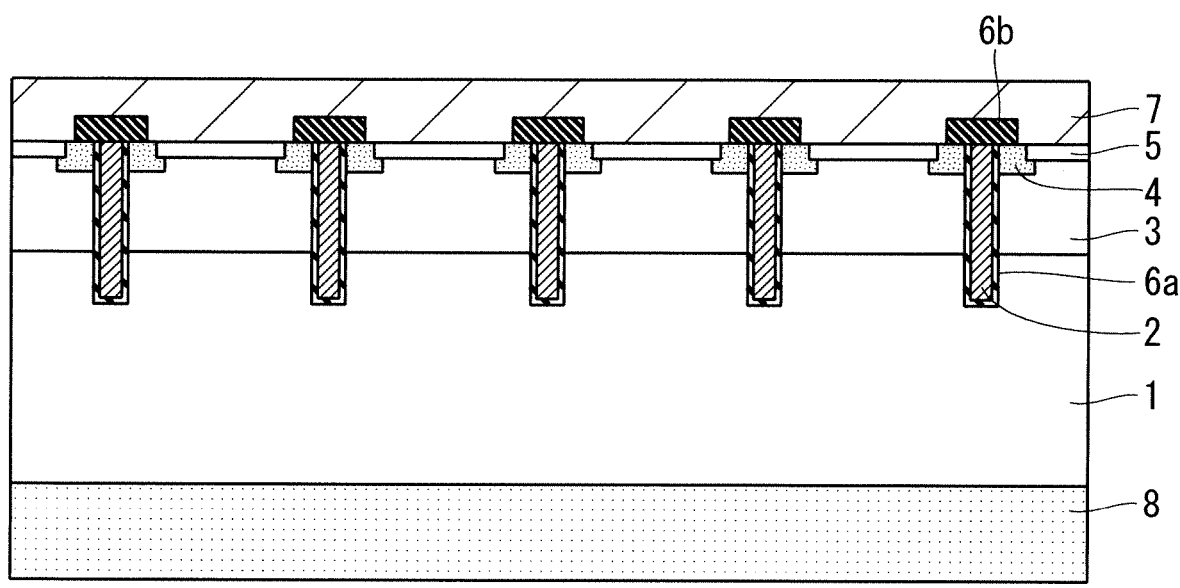
FIG. 15 is a cross-sectional view illustrating a method of manufacturing the semiconductor device according to the embodiment 1.

After the first impurity layer 13 is formed, proton is activated by furnace anneal at a temperature ranging from approximately 300° C. to approximately 500° C. to perform a first activation of forming the first buffer layer 8 from the first impurity layer 13 as illustrated in FIG. 15. Herein, thermal processing of the first activation needs to be optimized so that there is no crystal fault but there is impurity having a higher concentration than the N type impurity concentration of the semiconductor substrate in the portion between the first portion and the second portion.

Figure 16:
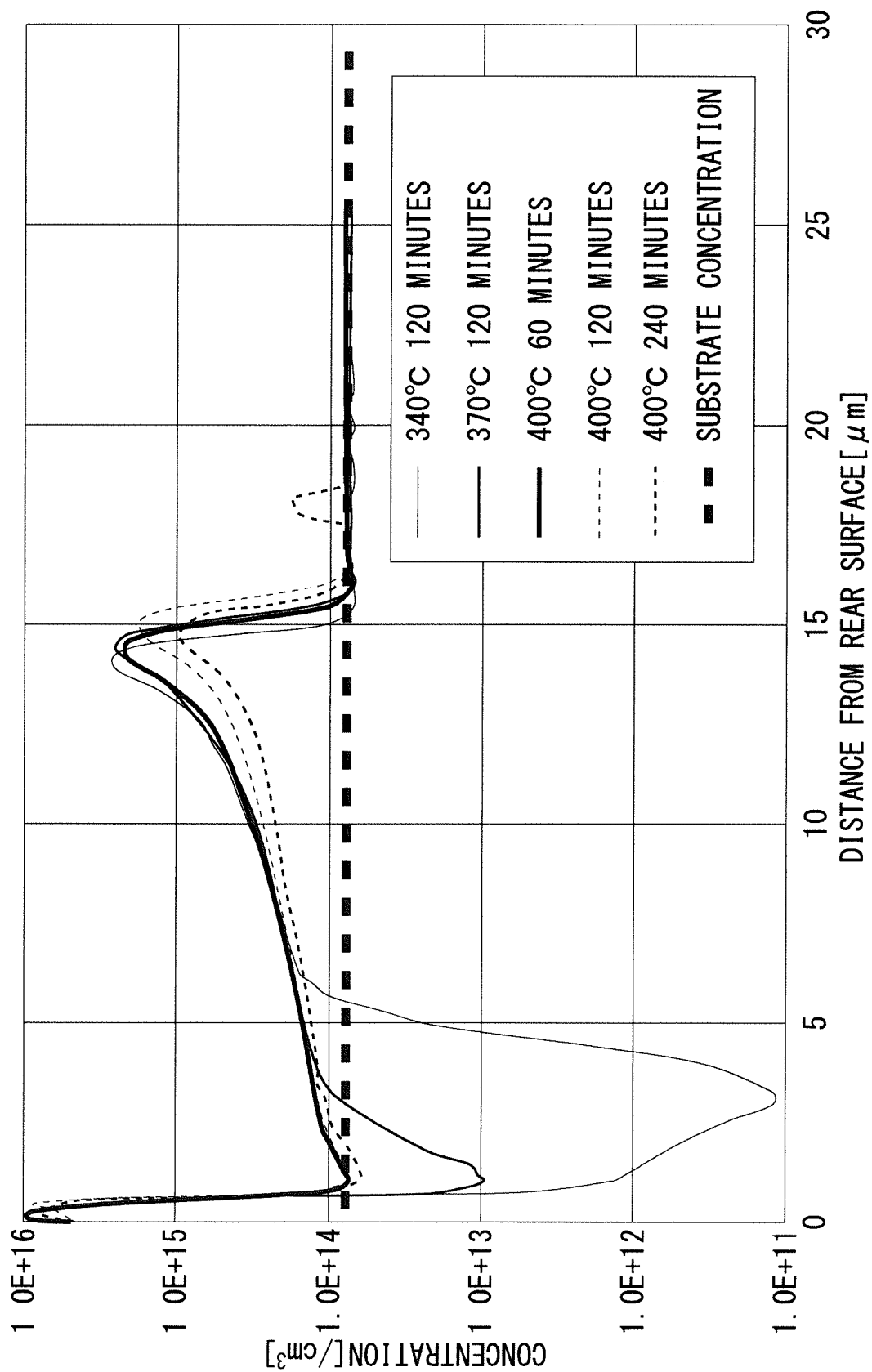
FIG. 16 is a drawing illustrating a rear surface profile of a device processed in different thermal processing conditions.

FIG. 16 is a drawing illustrating a rear surface profile of a plurality of devices with proton implanted in the amount of 1000 keV and 5.0E13 and processed in different thermal processing conditions.

Figure 17:
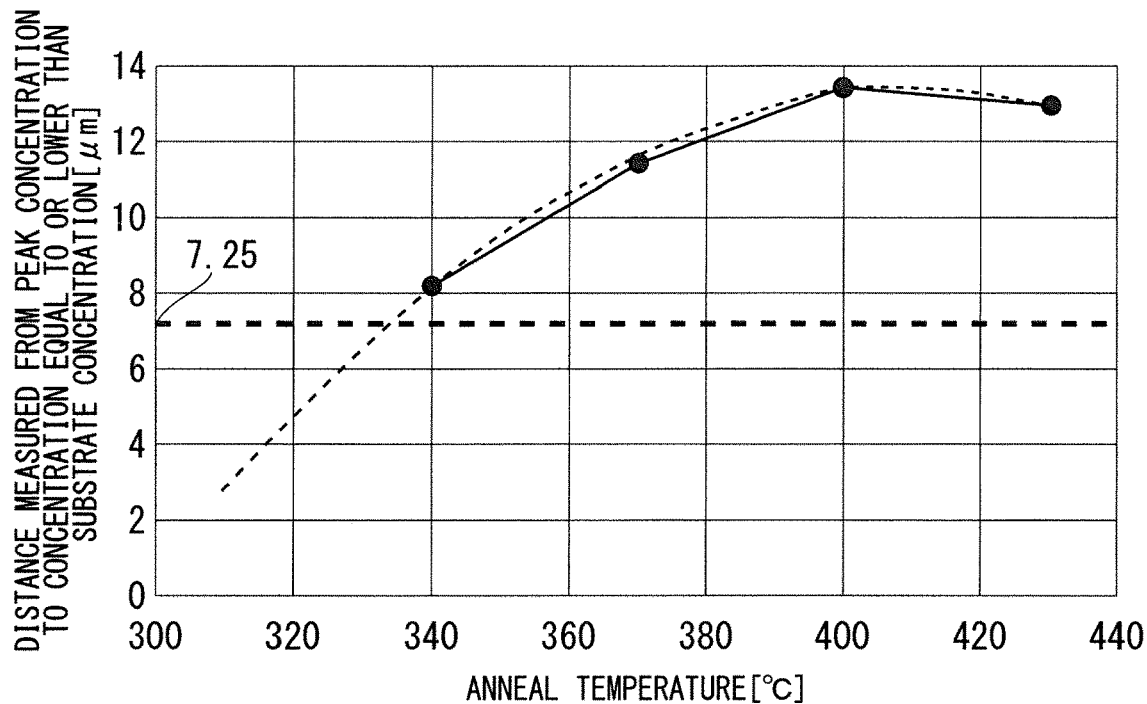
FIG. 17 is a drawing illustrating a relationship between an anneal temperature and a diffusion length.

FIG. 17 is a drawing illustrating a relationship between an anneal temperature and a diffusion length with the fixed anneal time of 120 minutes. Defined herein as the diffusion length is a distance measured from a peak concentration to a concentration equal to or lower than the concentration of the semiconductor substrate, in the first buffer layer 8 extending toward the side of the rear surface. As described above, the distance from the first portion having the first peak 81 and the second portion having the second peak 82 needs to be equal or larger than 14.5 μm, and proton is diffused from the first portion and the second portion. Thus, the diffusion length of half the distance described above (14.5 μm), that is to say, the diffusion length equal to or larger than 7.25 μm is necessary to make the N type impurity concentration of the portion between the first portion and the second portion higher than the N type impurity concentration of the semiconductor substrate. Confirmed by the result in FIG. 17 is that when the anneal time is 120 minutes, the thermal processing with a temperature of 340° C. or higher is necessary to make the diffusion length equal to or larger than 7.25 μm.

Figure 18:
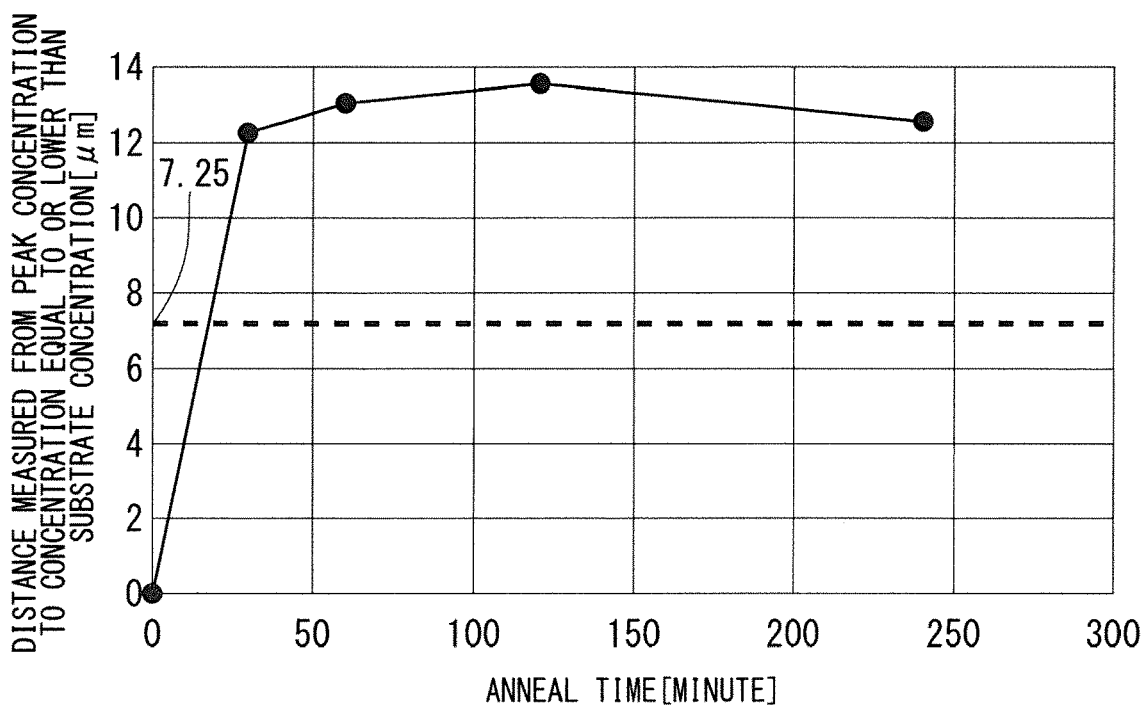
FIG. 18 is a drawing illustrating a relationship between an anneal time and a diffusion length.

FIG. 18 is a drawing illustrating a relationship between the anneal time and the diffusion length with the fixed anneal temperature of 400° C. Confirmed by the result in FIG. 18 is that when the anneal temperature is 400° C., the thermal processing for 20 minutes or longer is necessary to make the diffusion length equal to or larger than 7.25 μm.

Figure 19:
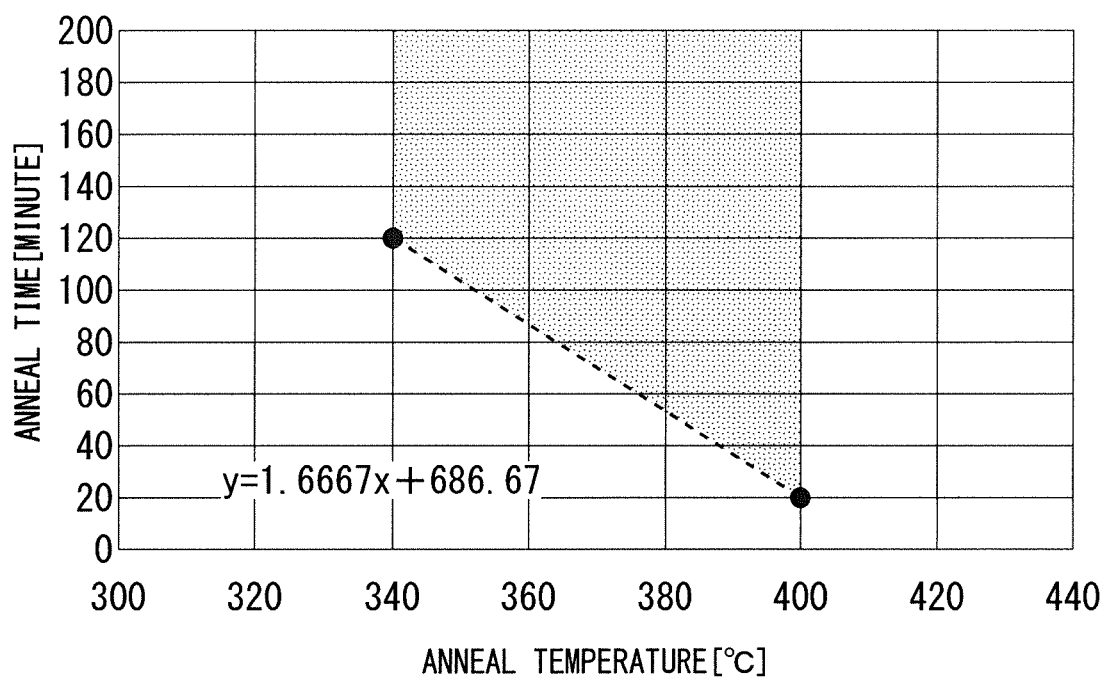
FIG. 19 is a drawing showing a result of examination of an anneal temperature and an anneal time when a diffusion length is equal to or larger than 7.25 μm.

FIG. 19 is a drawing showing a result of examination of the anneal temperature and the anneal time when the diffusion length is equal to or larger than 7.25 μm based on the result described above. As illustrated in FIG. 19, when x° C. indicates the anneal temperature and y minute indicates the anneal time, the diffusion length is equal to or larger than 7.25 μm in a range where y≥−1.6667x+686.67 is satisfied, that is to say, in a range hatched in FIG. 19 within a range where 340≤x≤400 is established. That is to say, according to the configuration satisfying the relationship of the expressions described above, the N type impurity concentration of the portion between the first portion having the first peak 81 and the second portion having the second peak 82 can be made higher than the N type impurity concentration of the semiconductor substrate.

Figure 20:
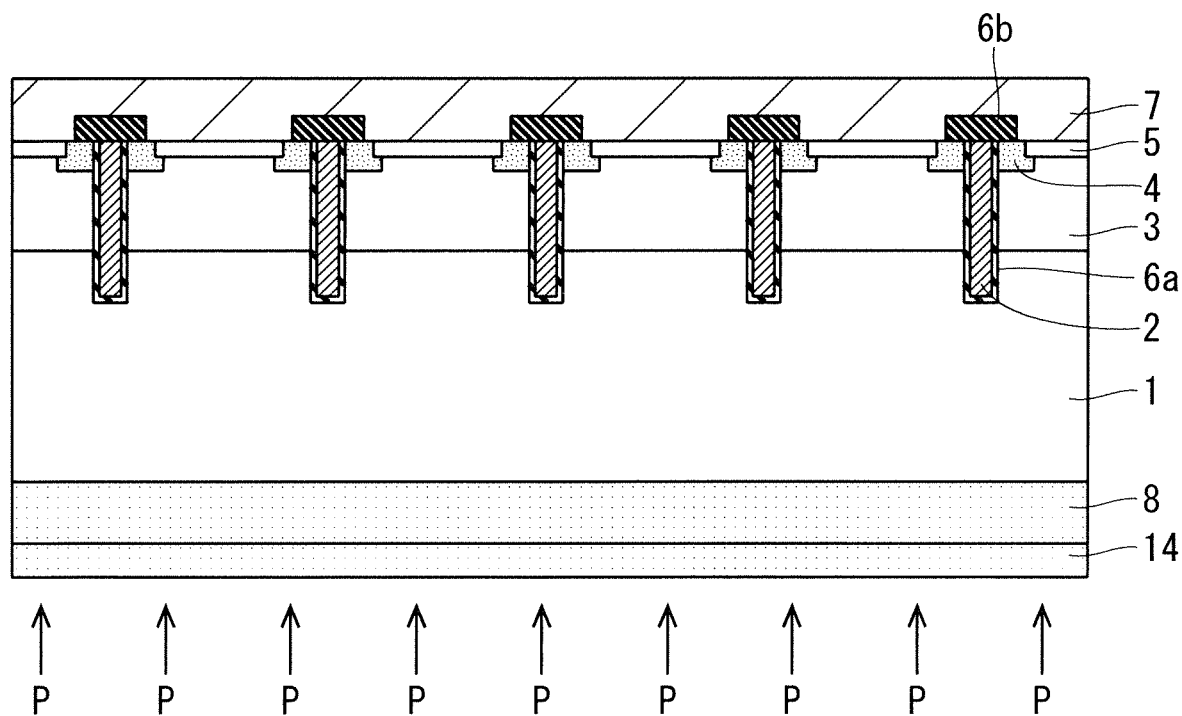
FIG. 20 is a cross-sectional view illustrating a method of manufacturing the semiconductor device according to the embodiment 1.

After the first buffer layer 8 is formed, as illustrated in FIG. 20, the N type impurity different from proton is implanted from the rear surface of the semiconductor substrate, thus an N type second impurity layer 14 is formed in a second surface portion on the side of the rear surface shallower than the first surface portion described above of the semiconductor substrate. The second impurity layer 14 is a layer constituting the second buffer layer 9. Phosphorus (P), for example, is used as the N type impurity of the second impurity layer 14, and an activation rate of the N type impurity of the second impurity layer 14 is higher than an activation rate of proton.

Figure 21:
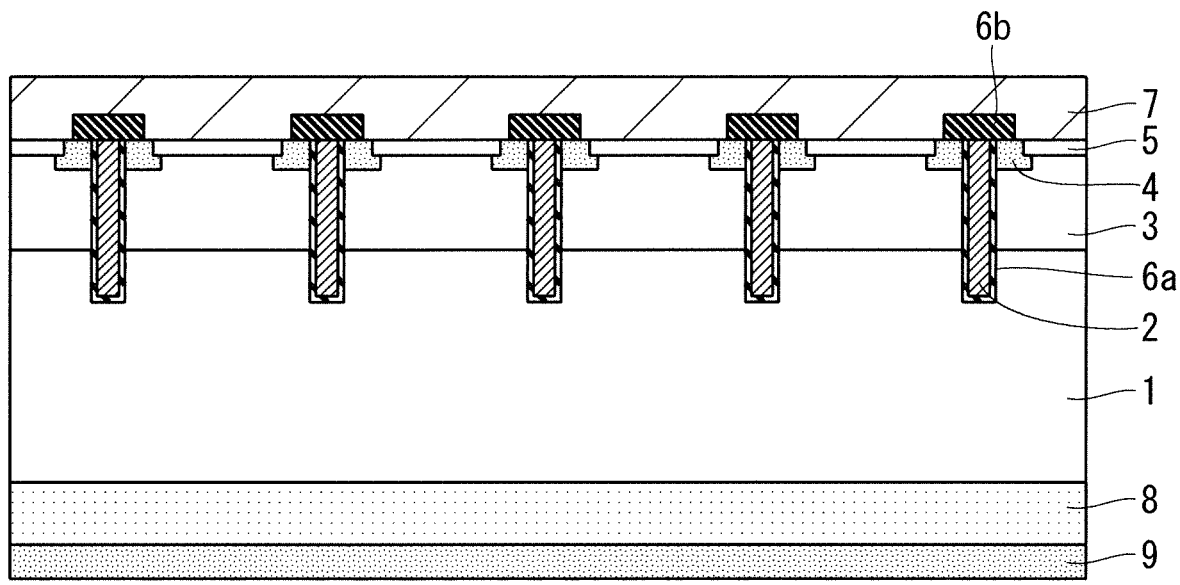
FIG. 21 is a cross-sectional view illustrating a method of manufacturing the semiconductor device according to the embodiment 1.

After the second impurity layer 14 is formed, the N type impurity of the second impurity layer 14 is activated by annealing such as laser anneal to perform a second activation of forming the second buffer layer 9 from the second impurity layer 14 as illustrated in FIG. 21.

Figure 22:
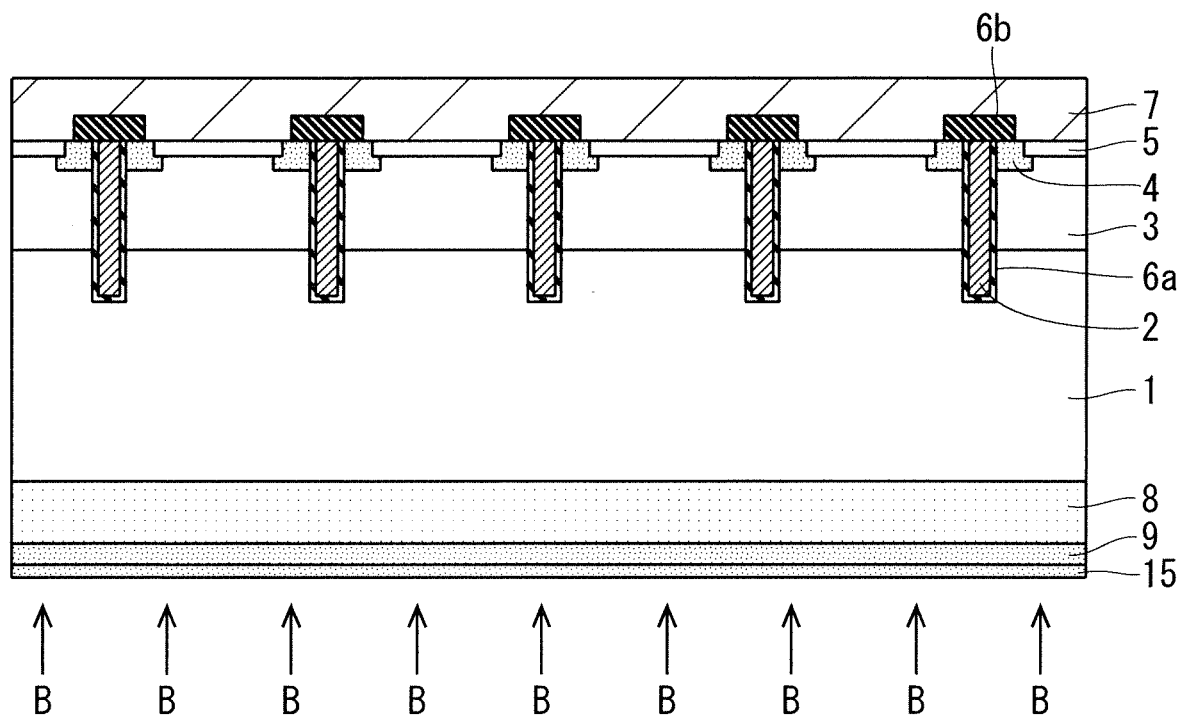
FIG. 22 is a cross-sectional view illustrating a method of manufacturing the semiconductor device according to the embodiment 1.

After the second buffer layer 9 is formed, as illustrated in FIG. 22, the P type impurity is implanted from the rear surface of the semiconductor substrate to form a P type third impurity layer 15 adjacent to the second buffer layer 9 on the side of the rear surface of the second buffer layer 9. The third impurity layer 15 is a layer constituting the collector layer 10. Boron (B), for example, is used as a P type impurity of the third impurity layer 15.

Figure 23:
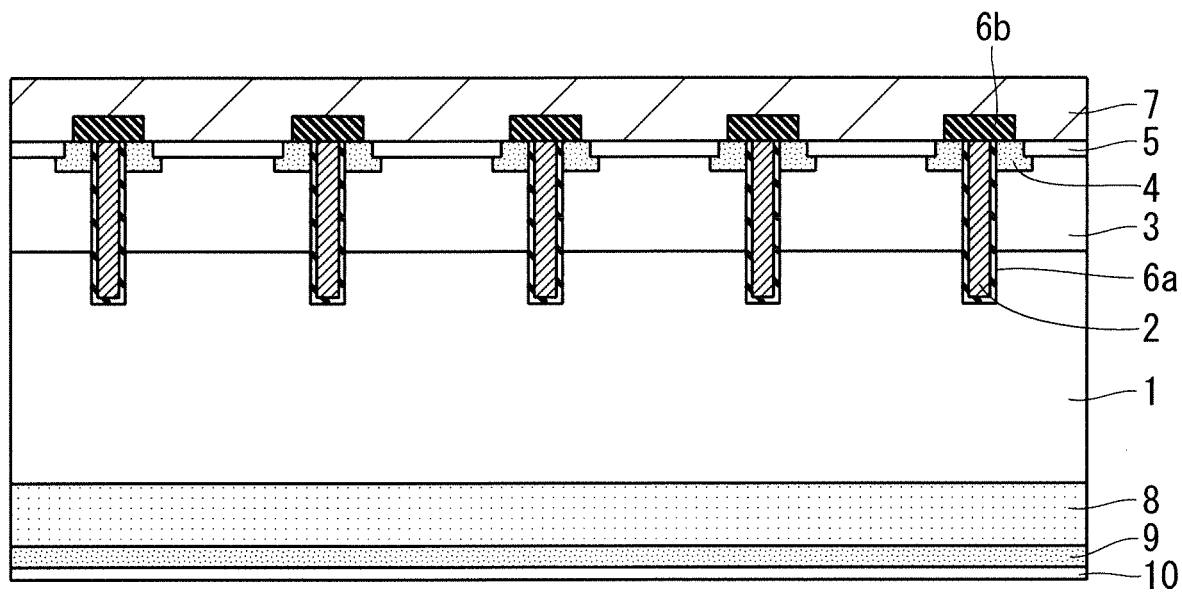
FIG. 23 is a cross-sectional view illustrating a method of manufacturing the semiconductor device according to the embodiment 1.

After the third impurity layer 15 is formed, the P type impurity of the third impurity layer 15 is activated by annealing such as laser anneal to perform a third activation of forming the collector layer 10 from the third impurity layer 15 as illustrated in FIG. 23.

An order of performing the proton implantation and furnace anneal, the phosphorus implantation and laser anneal, and the boron implantation and laser anneal may be switched as long as the annealing is performed after the implantation in each group, and a simple method in manufacturing is selected.

Figure 24:
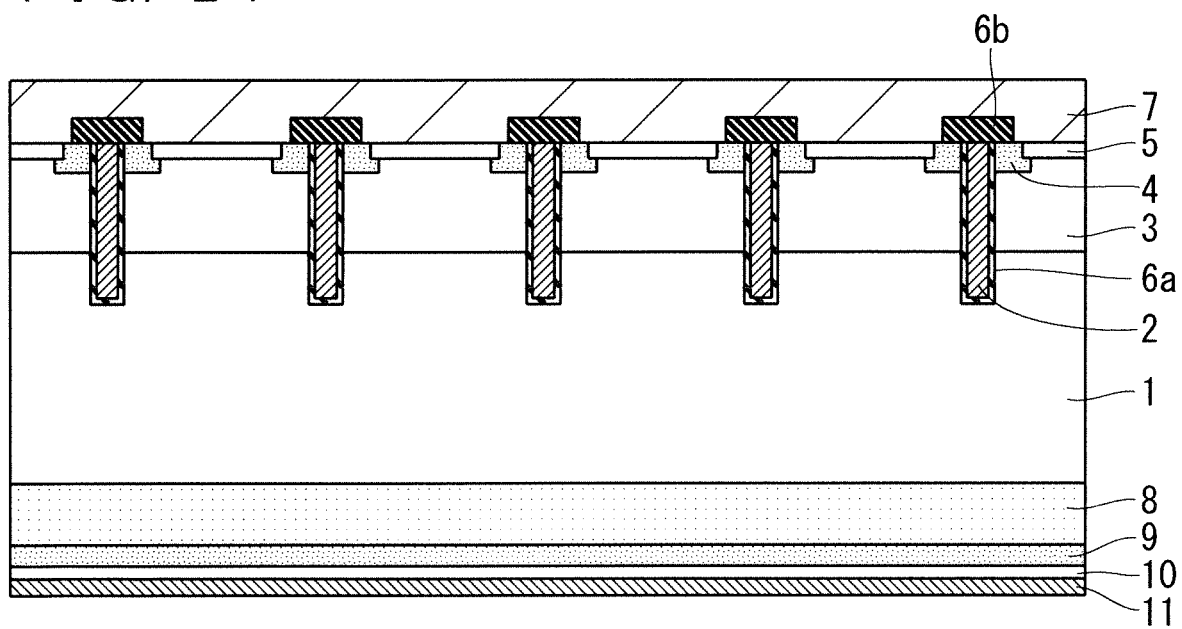
FIG. 24 is a cross-sectional view illustrating a method of manufacturing the semiconductor device according to the embodiment 1.

Subsequently, as illustrated in FIG. 24, the collector electrode 11 including a lamination structure of Al/Ti/Ni/Au or AlSi/Ti/Ni/Au or a single layer structure including any of these atoms is formed on the rear surface of the semiconductor substrate by sputtering, for example. Then, the thermal processing is performed for reducing contact resistance of the collector layer 10 and the collector electrode 11.

Outline of Embodiment 1

According to the semiconductor device in the present embodiment 1 described above, the number of changes of the acceleration voltage for implanting proton can be one, and the buffer layer can be formed by the acceleration voltage with two steps. Thus, the time required for changing the acceleration voltage can be reduced by almost half compared with the conventional manufacturing process in which the number of changes of the acceleration voltage is two, thus the productivity using the ion implanter can be improved.

In the present embodiment 1, the distance from the rear surface to the first portion having the first peak 81 is equal to or smaller than 4.0 μm, and the distance from the first portion having the first peak 81 to the second portion having the second peak 82 is equal to or larger than 14.5 μm. According to such a configuration, the suppression of the surge voltage at the time of switch-off, which is expected in the proton buffer layer, can be achieved.

Embodiment 2

FIG. 25 is a cross-sectional view of a major structure of a semiconductor device according to the present embodiment 2. The semiconductor device according to the embodiment 1 is the IGBT, however, the semiconductor device according to the present embodiment 2 is a diode.

The semiconductor device in FIG. 25 includes a semiconductor substrate having a front surface and a rear surface (main surface), and the semiconductor substrate includes a drift layer 21, an anode layer 22, a first buffer layer 24, a second buffer layer 25, and a cathode layer 26.

A conductive type of the drift layer 21 is an N type. In the present embodiment 2, a portion other than the anode layer 22, the first buffer layer 24, the second buffer layer 25, and the cathode layer 26 in the semiconductor substrate substantially constitutes the drift layer 21.

The anode layer 22 is disposed on the front surface of the semiconductor substrate, and is disposed on a side of a front surface of the drift layer 21 to be adjacent to the drift layer 21. A conductive type of the anode layer 22 is a P type. The anode electrode 23 is located on the anode layer 22.

The first buffer layer 24 is disposed on a side of a rear surface of the drift layer 21 to be adjacent to the drift layer 21. A conductive type of the first buffer layer 24 is an N type, and a configuration of the first buffer layer 24 is substantially the same as the configuration of the first buffer layer 8 in the embodiment 1.

The second buffer layer 25 is disposed on a side of a rear surface of the first buffer layer 24 to be adjacent to the first buffer layer 24. A conductive type of the second buffer layer 25 is an N type, and a configuration of the second buffer layer 25 is substantially the same as the configuration of the second buffer layer 9 in the embodiment 1.

The cathode layer 26 is disposed on the rear surface of the semiconductor substrate, and is disposed on a side of a rear surface of the second buffer layer 25 to be adjacent to the second buffer layer 25. A conductive type of the cathode layer 26 is an N type. A cathode electrode 27 is disposed on the rear surface of the semiconductor substrate, that is to say, on an opposite portion of the cathode layer 26 from the second buffer layer 25.

A method of manufacturing a diode which is the semiconductor device according to the present embodiment 2 is almost the same as the method of manufacturing the IGBT which is the semiconductor device according to the embodiment 1, thus the description there is omitted.

Outline of Embodiment 2

The semiconductor device according to the present embodiment 2 described above has the first buffer layer 24 and the second buffer layer 25 which are substantially the same as the first buffer layer 8 and the second buffer layer 9 in the embodiment 1. Thus, the productivity using the ion implanter can be improved in the manner similar to the case in embodiment 1, and moreover, the suppression of the surge voltage at the time of switch-off, which is expected in the proton buffer layer, can be achieved.

Modification Example

A trench is not provided in the diode in FIG. 25. However, the semiconductor device according to the present disclosure may be a diode in which a trench passing through the anode layer 22 to reach the drift layer 21 is formed and a dummy gate electrode is formed inside the trench via an insulating film in the manner similar to the trench of the IGBT. The semiconductor device according to the present disclosure may be a Merged PiN Schottky (MPS) diode having a MPS structure in which a PN junction diode and a Schottky barrier diode are combined with the anode layer 22.

In the diode in FIG. 25, the N type cathode layer 26 is provided over the whole rear surface of the second buffer layer 25. However, the semiconductor device according to the present disclosure may be a diode in which an N type cathode layer and a P type cathode layer are alternately provided along an in-plane direction of a semiconductor substrate in place of the N type cathode layer 26.

The semiconductor device according to the present disclosure may be a carrier stored trench bipolar transistor (CSTBT) made up of the base layer 3 in FIG. 1 provided with an N+ layer thereunder. The semiconductor device according to the present disclosure may be a reverse conducting IGBT (RC-IGBT) in which an IGBT region and a diode region are provided in one semiconductor substrate. The N type impurity of the second buffer layer 9 and the N type impurity of the second impurity layer 14 are phosphorus in the above description, however, the material thereof is not limited to phosphorus, and arsenic (As), for example, may also be adopted.

Each embodiment and each modification example can be arbitrarily combined, or each embodiment and each modification example can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising
a semiconductor substrate having a main surface, wherein the semiconductor substrate includes:
   an N type drift layer;
   an N type first buffer layer disposed on a side of the main surface of the substrate to be adjacent to the drift layer and including proton as an N type impurity; and
   an N type second buffer layer disposed on a side of the main surface of the substrate to be adjacent to the first buffer layer and including an N type impurity different from proton,
the first buffer layer includes:
   a first portion located in a thickness direction of the semiconductor substrate from the main surface of the substrate and having a first peak of an N type impurity concentration; and
   a second portion located farther away from the main surface of the substrate than the first portion and having a second peak of an N type impurity concentration,
   a distance from the main surface of the substrate to the first peak is equal to or smaller than 4.0 μm and greater than 0 μm,
   a distance from the first peak to the second peak is equal to or larger than 14.5 μm and less than a distance from the main surface of the substrate to the drift layer, and
   an N type impurity concentration of a portion between the first portion and the second portion is higher than an N type impurity concentration of the drift layer.

2. The semiconductor device according to claim 1, wherein
   the N type impurity of the second buffer layer includes phosphorus.

3. The semiconductor device according to claim 1, wherein
   the first peak is higher than the second peak.

4. The semiconductor device according to claim 3, wherein
   a peak of an N type impurity concentration of the second buffer layer is higher than the first peak.

5. The semiconductor device according to claim 1, wherein
   a half-value width of the first peak is smaller than a half-value width of the second peak, and
   a half-value width of a peak of the N type impurity concentration of the second buffer layer is smaller than a half-value width of the first peak.

6. The semiconductor device according to claim 1, wherein
   specific resistance of the drift layer is equal to or larger than 50 Ω·cm and equal to or smaller than 67 Ω·cm, and
   a total thickness of the drift layer, the first buffer layer, and the second buffer layer is equal to or larger than 110 μm and equal to or smaller than 130 μm.

7. The semiconductor device according to claim 1, wherein
   specific resistance of the drift layer is equal to or larger than 90 Ω·cm and equal to or smaller than 130 Ω·cm, and
   a total thickness of the drift layer, the first buffer layer, and the second buffer layer is equal to or larger than 170 μm and equal to or smaller than 210 μm.

8. The semiconductor device according to claim 1, wherein
   specific resistance of the drift layer is equal to or larger than 130 Ω·cm and equal to or smaller than 180 Ω·cm, and
   a total thickness of the drift layer, the first buffer layer, and the second buffer layer is equal to or larger than 200 μm and equal to or smaller than 260 μm.

9. The semiconductor device according to claim 1, wherein
   specific resistance of the drift layer is equal to or larger than 200 Ω·cm and equal to or smaller than 300 Ω·cm, and
   a total thickness of the drift layer, the first buffer layer, and the second buffer layer is equal to or larger than 340 μm and equal to or smaller than 420 μm.

10. The semiconductor device according to claim 1, wherein
    specific resistance of the drift layer is equal to or larger than 300 Ω·cm and equal to or smaller than 400 Ω·cm, and a total thickness of the drift layer, the first buffer layer, and the second buffer layer is equal to or larger than 420 μm and equal to or smaller than 520 μm.

11. The semiconductor device according to claim 1, wherein
specific resistance of the drift layer is equal to or larger than 600 Ω·cm and equal to or smaller than 800 Ω·cm, and
a total thickness of the drift layer, the first buffer layer, and the second buffer layer is equal to or larger than 580 μm and equal to or smaller than 720 μm.

12. The semiconductor device according to claim 1, wherein
the N type impurity concentration of the entire portion between the first portion and the second portion is lower than the N type impurity concentration of the second peak.

13. The semiconductor device according to claim 1, wherein
the distance from the first peak to the second peak is equal to or less than 24.5 μm.

\* \* \* \* \*